United States Patent
Sunamura et al.

(10) Patent No.: US 7,804,085 B2
(45) Date of Patent: Sep. 28, 2010

(54) SOLID ELECTROLYTE SWITCHING ELEMENT, AND FABRICATION METHOD OF THE SOLID ELECTROLYTE ELEMENT, AND INTEGRATED CIRCUIT

(75) Inventors: Hiroshi Sunamura, Minato-ku (JP); Naoya Inoue, Minato-ku (JP); Toshitsugu Sakamoto, Minato-ku (JP); Hisao Kawaura, Minato-ku (JP)

(73) Assignee: NEC Corporation, Tokyo (JP)

( * ) Notice: Subject to any disclaimer, the term of this patent is extended or adjusted under 35 U.S.C. 154(b) by 490 days.

(21) Appl. No.: 11/814,053

(22) PCT Filed: Jan. 16, 2006

(86) PCT No.: PCT/JP2006/300420

§ 371 (c)(1),
(2), (4) Date: Jul. 16, 2007

(87) PCT Pub. No.: WO2006/075731

PCT Pub. Date: Jul. 20, 2006

(65) Prior Publication Data

US 2009/0020742 A1   Jan. 22, 2009

(30) Foreign Application Priority Data

Jan. 17, 2005   (JP) .............................. 2005-009430

(51) Int. Cl.
*H01L 47/00* (2006.01)
(52) U.S. Cl. .................. 257/4; 257/8; 257/E29.002; 257/E29.068
(58) Field of Classification Search ............. 257/1–8, 257/214, 298, 751, E29.002, E29.068, E29.079, 257/E45.002, E45.003, E23.01, E27.107; 438/95, 102, 104, 408; 427/255.29–255.37; 326/39; 327/65; 365/153, 158, 177
See application file for complete search history.

(56) References Cited

U.S. PATENT DOCUMENTS 5,761,115 A   6/1998   Kozicki et al.

(Continued)

FOREIGN PATENT DOCUMENTS

JP    2001-274160 A   10/2001

(Continued)

OTHER PUBLICATIONS

Sakamoto, et al., "A Nonvolatile Programmable Solid Electrolyte Nanometer Switch", 2004 IEEE International Solid-State Circuits Conference. Digest of Technical Papers, 2004, pp. 290-291, IEEE.
Sakamoto, et al., "Nanometer-scale switches using copper sulfide", Applied Physics Letters, May 5, 2003, pp. 3032-3034, vol. 82, No. 18, American Institute of Physics.

*Primary Examiner*—Matthew C Landau
*Assistant Examiner*—Jessica Hall
(74) *Attorney, Agent, or Firm*—Sughrue Mion, PLLC

(57) ABSTRACT

The switching element of the present invention is of a configuration that includes: a first electrode (14) and a second electrode (15) provided separated by a prescribed distance; a solid electrolyte layer (16) provided in contact with the first electrode (14) and the second electrode (15); a third electrode (18) that can supply metal ions and that is provided in contact with the solid electrolyte layer (16); and a metal diffusion prevention film (17) that covers points of the surface of the solid electrolyte layer (16) that are not in contact with the first electrode (14), the second electrode (15) or the third electrode (18). This configuration prevents the adverse effect of metal ions upon other elements.

19 Claims, 18 Drawing Sheets

U.S. PATENT DOCUMENTS

| | | |
|---|---|---|
| 6,487,106 B1 | 11/2002 | Kozicki |
| 7,116,573 B2 * | 10/2006 | Sakamoto et al. ........... 365/153 |
| 2008/0211096 A1 * | 9/2008 | Sakamoto et al. ........... 257/751 |

FOREIGN PATENT DOCUMENTS

| | | |
|---|---|---|
| JP | 2001-525606 A | 12/2001 |
| JP | 2002-536840 A | 10/2002 |
| JP | 2003-92387 A | 3/2003 |
| JP | 2004-31866 A | 1/2004 |
| WO | WO 03/094227 A1 | 11/2003 |

* cited by examiner

SOLID ELECTROLYTE SWITCHING ELEMENT, AND FABRICATION METHOD OF THE SOLID ELECTROLYTE ELEMENT, AND INTEGRATED CIRCUIT

TECHNICAL FIELD

The present invention relates to a solid electrolyte switching element that includes an electrode that correspond to a gate that can supply metal ions and electrodes that correspond to a source and a drain, to a fabrication method, and to an integrated circuit.

BACKGROUND ART

U.S. Pat. Nos. 5,761,115 and 6,487,106 disclose cases in which a programmable metallization cell (PMC) is applied as a solid electrolyte switch of the related art. In a PMC, two electrodes are provided with a solid electrolyte interposed, a suitable amount of metal ions being dissolved in the solid electrolyte. In the working examples in the above-described documents, the solid electrolyte is a construction in which silver ions are introduced into a chalcogenide glass containing germanium or selenium. The solid electrolyte switch is an element for controlling the electrical resistance between the two electrodes by applying voltage between these two electrodes to bring about an oxidation-reduction reaction of the metal ions in the solid electrolyte.

To briefly explain the operation of this solid electrolyte switch, a state of high resistance exists between the two electrodes in the initial state, but when voltage is applied across these two electrodes, the metal ions in the solid electrolyte at one of the electrodes (the cathode side) to which a relative negative voltage is applied are reduced and precipitate as metal atoms. The continuation of the reduction reaction causes the precipitated metal to grow toward the other electrode (the anode) until a metal bridge is finally formed between the two electrodes and an electrical low-resistance state is established between the two electrodes.

On the other hand, when a positive voltage is applied to the cathode side in the state in which the metal bridge is formed, the metal bridge oxidizes and dissolves into the solid electrolyte as metal ions. The electrical high resistance state is reestablished between the electrodes when this metal bridge ceases to exist. The high-resistance state and low-resistance state are each maintained when voltage is not applied, and the solid electrolyte switch therefore is a non-volatile switch with an extremely high ON/OFF ratio, and can be expected to be applicable to non-volatile memory. In addition, the anode also serves the role of a supply source of metal ions, and preferably contains metal that is prone to ionization (such as silver) for the purpose of stable operation.

DISCLOSURE OF THE INVENTION

In the above-described two-terminal solid electrolyte switch, when a metal bridge is formed between the two terminals at the time of a transition from the OFF state to the ON state, a low-resistance state is established between the two terminals and a large current flows between the two terminals. When transitioning from the ON state to the OFF state, voltage for bringing about the OFF state between the two terminals is then applied while in the low-resistance state, resulting in the problem of a large flow of current and a high level of power consumption.

One means of solving this problem is a three-terminal solid electrolyte switch that is provided with a terminal for control in addition to the above-described two terminals. In this solid electrolyte switch, the application of voltage across an electrode that corresponds to a gate electrode capable of supplying metal ions and two electrodes that correspond to source and drain electrodes brings about the precipitation or dissolution of metal in the vicinity of the source and drain electrodes to control the electrical resistance between the source and drain electrodes. In this construction, the resistance between the source and drain electrode can be controlled by the voltage that is applied to the gate electrode, and there is consequently no flow of current other than that required when switching between ON and OFF.

However, when integrating this three-terminal solid electrolyte switch, the concern arises that metal ions will leak from the solid electrolyte layer or interconnect layer into surrounding regions and thus adversely affect neighboring elements.

The present invention was realized to solve the above-described problem inherent to the related art and has as its object the provision of: a solid electrolyte switching element that eliminates the influence of metal ions upon other elements, a method of fabricating this solid electrolyte switching element, and an integrated circuit.

The solid electrolyte switching element of the present invention for achieving the above-described object is of a construction that includes: a first electrode and a second electrode provided separated by prescribed distance, a solid electrolyte layer provided in contact with the first electrode and second electrode, a third electrode that is provided in contact with the solid electrolyte layer and that can supply metal ions, and a metal diffusion prevention film that covers points of the surface of the solid electrolyte layer that do not contact any of the first electrode, second electrode, and third electrode.

The integrated circuit of the present invention for achieving the above-described object is equipped with the above-described solid electrolyte switching element of the present invention and multilayered interconnects that include an interconnects and a viaplug, and is of a configuration in which the third electrode is provided in the same layer as the interconnects and the solid electrolyte layer is provided in the same layer as the viaplug.

In addition, the integrated circuit of the present invention is provided with the solid electrolyte switching element of the above-described invention and multilayered interconnects that include interconnects and viaplug, and is of a configuration in which the third electrode is provided on the same layer as the viaplug and the solid electrolyte layer is provided on the same layer as the interconnects.

In addition, the fabrication method of the solid electrolyte switching element of the present invention for achieving the above-described object includes steps of: forming a resist having a first aperture pattern and a second aperture pattern separated by a prescribed distance on an insulating layer; enlarging the area of the apertures of the first aperture pattern and the second aperture pattern by means of a first etching; carrying out a second etching of the insulating layer with the resist as a mask to form a first aperture and a second aperture in the insulating layer; after removing the resist, embedding an interconnect material in the first aperture and second aperture to form a first electrode and a second electrode; forming a solid electrolyte layer that contacts the first electrode and the second electrode; forming a metal diffusion prevention film that covers the solid electrolyte layer; forming a third aperture in the metal diffusion prevention film; and embedding an interconnect material that can supply metal ions in the third aperture to form a third electrode.

Still further, the fabrication method of the solid electrolyte switching element of the present invention includes steps of: forming a resist having a first aperture pattern and a second aperture pattern separated by a prescribed distance on an insulating layer; carrying out first etching on the insulating layer with the resist as a mask to form a first aperture and a second aperture on the insulating layer; carrying out a second etching on the insulating layer to enlarge the areas of the first aperture and second aperture; after removing the resist, embedding an interconnect material in the first aperture and second aperture to form a first electrode and second electrode; forming a solid electrolyte layer that contacts the first electrode and second electrode; forming a metal diffusion prevention film that covers the solid electrolyte layer; forming a third aperture in the metal diffusion prevention film; and embedding an interconnect material that can supply metal ions in the third aperture to form a third electrode.

In the present invention, points on the surface of the solid electrolyte layer that do not contact any of the first electrode, the second electrode, or the third electrode are covered by a metal diffusion prevention film, whereby the leakage and diffusion of metal ions contained in the solid electrolyte layer can be prevented. Thus, when the solid electrolyte switching element is provided in an integrated circuit, metal ions that leak to the surrounding area from the solid electrolyte layer can be prevented from adversely affecting adjacent elements.

EXPLANATION OF REFERENCE NUMBERS 14 first interconnect
15 second interconnect
16 solid electrolyte layer
17 metal diffusion prevention film
18 third interconnect

BEST MODE FOR CARRYING OUT THE INVENTION

The solid electrolyte switching element of the present invention is of a configuration provided with a film for preventing the diffusion of metal from a solid electrolyte layer.

First Embodiment

Explanation next regards the configuration of the solid electrolyte switching element of the present embodiment.

Figure 1A:
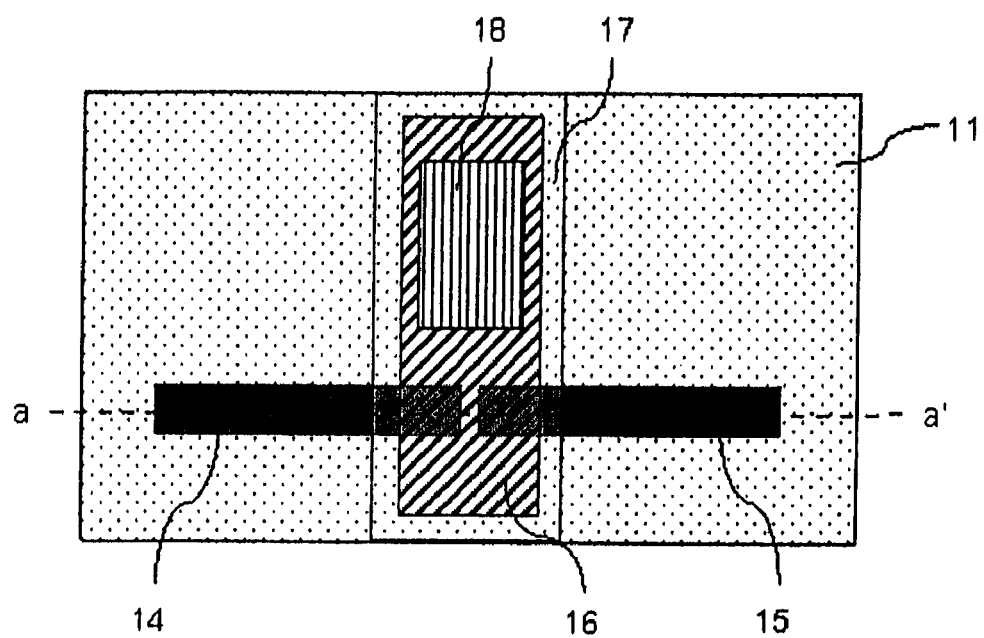
FIG. 1A is a plan view showing an example of the configuration of the solid electrolyte switching element of the first embodiment.
Figure 1B:
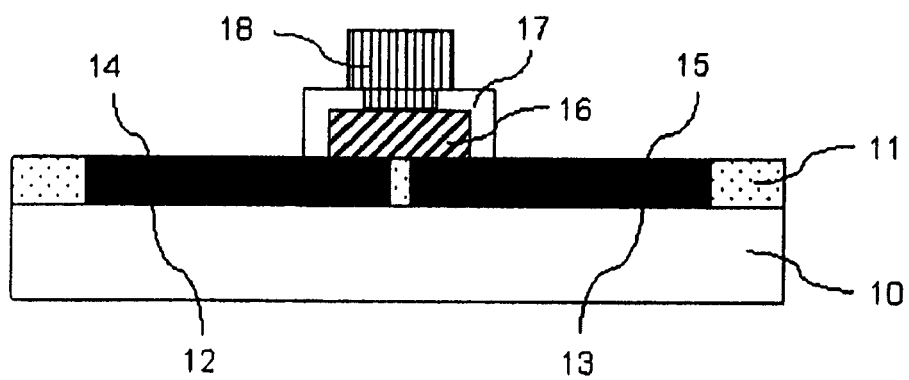
FIG. 1B is a sectional view showing an example of the configuration of the solid electrolyte switching element of the first embodiment.

FIGS. 1A and 1B show an example of the configuration of the solid electrolyte switching element of the first embodiment. FIG. 1A is a plan view of the element, and FIG. 1B is a sectional view taken along broken line a-a' shown in FIG. 1A.

As shown in FIGS. 1A and 1B, solid electrolyte switching element 1 is provided with: insulating layer 11 that is formed including first aperture 12 and second aperture 13 provided separated by a prescribed distance on substrate 10 that is covered by a base insulating film; first interconnect 14 realized by embedding an interconnect material in first aperture 12; and second interconnect 15 realized by embedding an interconnect material in second aperture 13. In addition, solid electrolyte layer 16 is formed on first interconnect 14 and second interconnect 15, and metal diffusion prevention film 17 for preventing the diffusion of metal is formed on solid electrolyte layer 16. Third interconnect 18 that contacts solid electrolyte layer 16 through an aperture provided in metal diffusion prevention film 17 is formed on metal diffusion prevention film 17. Third interconnect 18 contains a material capable of supplying metal ions to solid electrolyte layer 16. Insulating layer 11 not only serves to maintain electrical insulation but also serves as a metal diffusion prevention film.

The side surfaces and points of the upper surface of solid electrolyte layer 16 that do not contact third interconnect 18 are covered by metal diffusion prevention film 17.

Although third interconnect 18 is not arranged in the a-a' portion of FIG. 1A, for the purpose of explanation, third interconnect 18 is displayed in the sectional view of FIG. 1B provided with the aperture portion of metal diffusion prevention film 17 interposed.

In the present invention, the spacing of first interconnect 14 and second interconnect 15 is a dimension smaller than the minimum value of the limits of lithography. As a result, the dimension is smaller than in constructions of the related art. In the current actual case, this dimension is formed as a dimension no greater than 30 nm.

The configuration shown in FIGS. 1A and 1B is only one example. The solid electrolyte switching element of the present invention may be of a construction other than shown in FIGS. 1A and 1B as long as an arrangement is realized in which first interconnect 14 and second interconnect 15 are embedded in first aperture 12 and second aperture 13 that are provided separated by a prescribed distance on insulating layer 11, solid electrolyte layer 16 contacts first interconnect 14 and second interconnect 15, and third interconnect 18 contacts solid electrolyte layer 16.

Explanation next regards the operation of solid electrolyte switching element 1 shown in FIGS. 1A and 1B. Here, first interconnect 14 is assumed to be the source electrode, second interconnect 15 is assumed to be the drain electrode, and third interconnect 18 is assumed to be the gate electrode. The material of solid electrolyte layer 16 is copper sulfide, the interconnect material of the gate electrode is copper, and the interconnect material of the source electrode and drain electrode is titanium.

When the source electrode is grounded and a positive voltage is applied to the gate electrode, the copper of the gate electrode becomes copper ions and dissolves in solid electrolyte layer 16. The copper ions that have dissolved into solid electrolyte layer 16 become copper and precipitate on the surface of the drain electrode, and the precipitated copper electrically connects the drain electrode and source electrode. The electrical connection of the drain electrode and source electrode causes the solid electrolyte switching element to enter the ON state.

On the other hand, when the source electrode is grounded in the above-described ON state and a negative voltage is applied to the gate electrode, the precipitated copper between the drain electrode and source electrode dissolves in solid electrolyte 16, whereby the electrical connection between the drain electrode and source electrode is cut. The electrical disconnection between the drain electrode and source electrode causes the solid electrolyte switching element to enter the OFF state. In addition, from the stage preceding the complete of the electrical disconnection, the electrical properties undergo changes such as an increase in the resistance between the drain electrode and source electrode and variation in the inter-electrode capacitance, following which the electrical connection is cut.

In the solid electrolyte switching element, the distance between the source electrode and drain electrode is set to a dimension smaller than the minimum value of the limits of lithography. The distance between the source electrode and drain electrode can be made sufficiently small compared to the distance between the gate electrode and source electrode and the distance between the gate electrode and the drain electrode. As a result, when switching from the OFF state to the ON state, the metal that precipitates connects the source electrode and drain electrode before a connection is realized between the gate electrode and the drain electrode. The switching from the OFF state to the ON state is therefore more stable than in the related art, and stable switching operations can therefore be repeated.

In addition, points of solid electrolyte layer 16 that do not contact any of first interconnect 14, second interconnect 15, and third interconnect 18 are covered by at least one of metal diffusion prevention film 17 and insulating layer 11 that serve as metal diffusion prevention films, whereby metal ions do not diffuse to the surrounding area. As a result, the metal ions can be prevented from exerting an adverse influence on neighboring elements, and the solid electrolyte switching element of the present embodiment can be used together with other elements in an integrated circuit.

Insulating layer 11 is here assumed to be a metal diffusion prevention film, but insulating layer 11 may also be of a construction in which a plurality of insulating films are stacked. In such a case, the insulating film of the uppermost layer serves as the metal diffusion prevention film.

Explanation next regards the fabrication method of solid electrolyte switching element 1 shown in FIGS. 1A and 1B. FIGS. 2A to 2I are plan views and sectional views showing the fabrication method of the solid electrolyte switching element of the present embodiment. The sectional views show the portion of broken line a-a' in the plan view.

A semiconductor circuit that includes semiconductor elements such as transistors and resistors is formed on a semiconductor substrate by means of integrated circuit fabrication methods of the related art, and a base insulating film for maintaining insulation between semiconductor elements is formed. A substrate on which a semiconductor circuit and a base insulating film for protecting the semiconductor circuits are thus formed is referred to as simply "substrate 10." This provision of an insulating film for protecting semiconductor circuits serves the purpose of electrically isolating solid electrolyte switching element 1 and the semiconductor circuits.

The base insulating film may be an insulating material used in integrated circuits of the related art. For example, the base insulating film is preferably a compound of silicon and an oxygen, and is preferably a low-permittivity insulating film to which any amount of hydrogen, fluorine, carbon and nitrogen have been added. The low-permittivity insulating film is an insulating film having a lower dielectric constant than a silicon oxide film. In addition, plugs (not shown) are provided in the portion in which semiconductor circuits and solid electrolyte switching element 1 electrically connect. The construction and method of fabricating the plugs are the same as in the related art and detailed explanation is therefore here omitted.

Figure 2A:
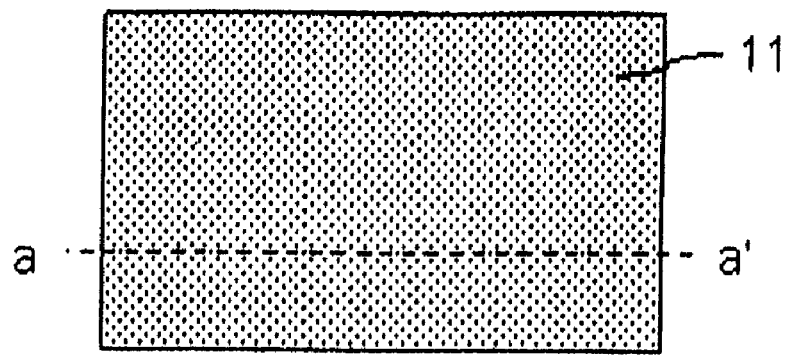
FIG. 2A is a sectional view showing the fabrication method of the solid electrolyte switching element of the first embodiment.

As shown in FIG. 2A, insulating layer 11 of silicon nitride is formed to a film thickness of 20-100 nm on substrate 10. This insulating layer 11 is not limited to silicon nitride and may also be a material in which any amount of carbon has been mixed in silicon nitride. Insulating layer 11 suppresses the diffusion of metal ions into substrate 10.

Figure 2B:
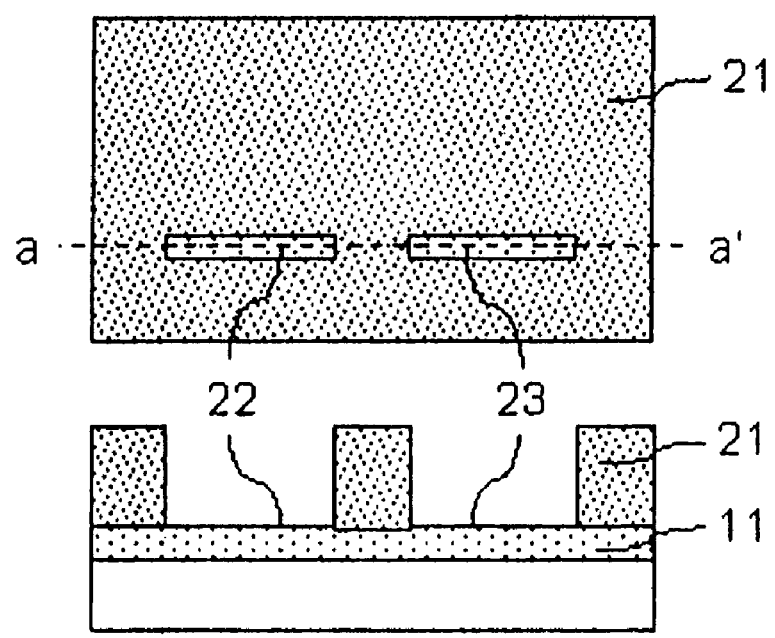
FIG. 2B is a sectional view showing the fabrication method of the solid electrolyte switching element of the first embodiment.
Figure 2C:
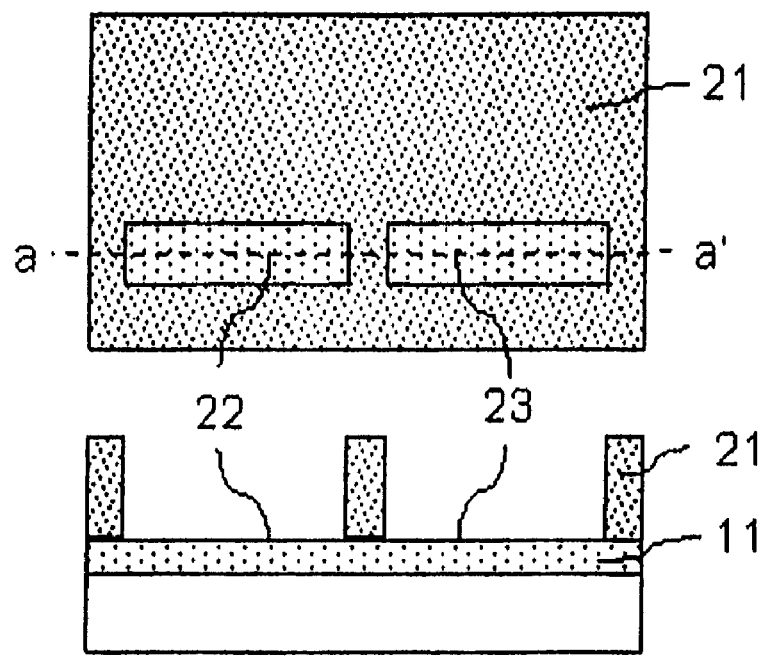
FIG. 2C is a sectional view showing the fabrication method of the solid electrolyte switching element of the first embodiment.

A resist pattern having apertures is next formed on insulating layer 11 as next described. After applying a photoresist to insulating layer 11, an exposure process is carried out. The exposed photoresist is next subjected to a development process to form photoresist 21 having first aperture pattern 22 and second aperture pattern 23 as shown in FIG. 2B. The spacing between first aperture pattern 22 and second aperture pattern 23 is a distance at the minimum limits of lithographic processing. Photoresist 21 is next subjected to first dry etching having an isotropic etching characteristic to enlarge the area of the apertures of first aperture pattern 22 and second aperture pattern 23 (FIG. 2C). The conditions of this first dry etching can be found by using an etching apparatus of the related art to optimize the etching gas.

Figure 2D:
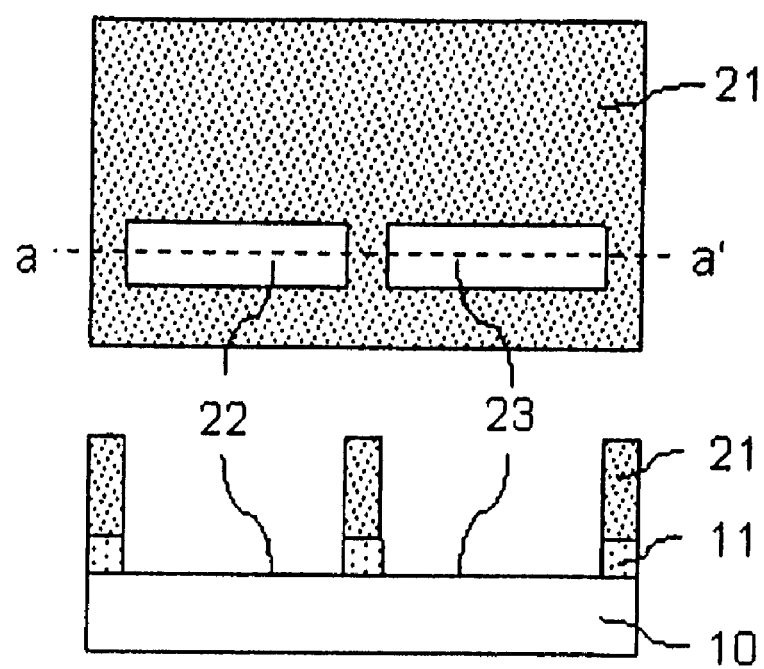
FIG. 2D is a sectional view showing the fabrication method of the solid electrolyte switching element of the first embodiment.

Insulating layer 11 is then subjected to a second dry etching from above first aperture pattern 22 and second aperture pattern 23 for which the aperture areas have been enlarged, whereby first aperture 12 and second aperture 13 are formed in insulating layer 11 as shown in FIG. 2D. The spacing between first aperture 12 and second aperture 13 is formed to a distance that is still smaller than photoresist pattern 21 of FIG. 2B that was formed at the minimum value of the limits of lithography. The optimization of the etching conditions enabled a decrease of this spacing to 30-15 nm. Next, by removing the photoresist by acidic peeling and ashing processes, first aperture 12 and second aperture 13 separated by the above-described micro distance are formed in insulating layer 11 as shown in FIG. 2E.

Explanation here regards another method for forming first aperture 12 and second aperture 13 separated by the above-described micro distance in insulating layer 11. Photoresist 21 having first aperture pattern 22 and second aperture pattern 23 is formed on insulating layer 11. The spacing between first aperture pattern 22 and second aperture pattern 23 is formed to the minimum value of the limits of lithography as in the configuration shown in FIG. 2B. Insulating layer 11 is then subjected to a first dry etching having anisotropic etching characteristics, to form a first preparatory aperture corresponding to first aperture pattern 22 and a second preparatory aperture corresponding to second aperture pattern 23. A second dry etching having isotropic etching characteristics is next carried out to enlarge the aperture areas of the first preparatory aperture and the second preparatory aperture, whereby first aperture 12 and second aperture 13 are formed in insulating layer 11. Photoresist 21 is then removed to complete fabrication of the construction shown in FIG. 2E.

In this method as well, the spacing between first aperture 12 and second aperture 13 can be formed to a distance even smaller than the minimum value of the limits of lithography. Optimization of the etching conditions can then further reduce this spacing to the order of 30-15 nm.

Figure 2E:
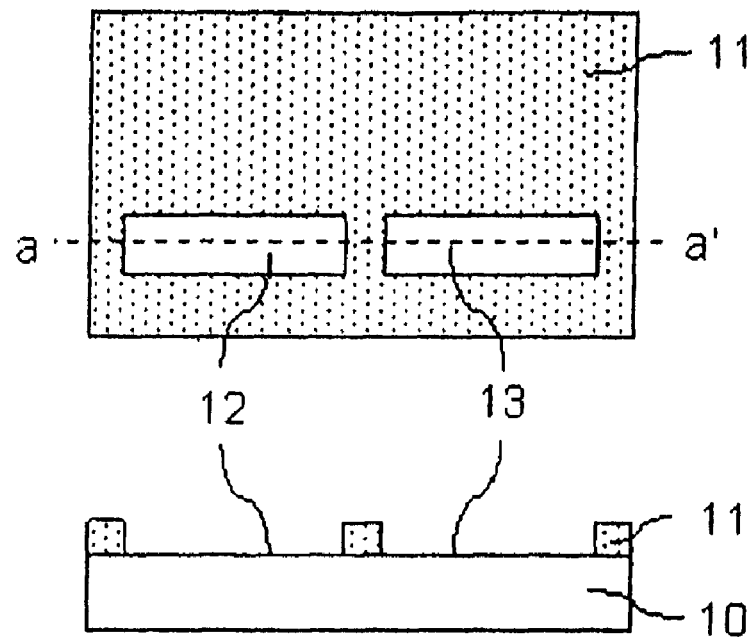
FIG. 2E is a sectional view showing the fabrication method of the solid electrolyte switching element of the first embodiment.

After first aperture 12 and second aperture 13 have been formed in insulating layer 11 as shown in FIG. 2E, first interconnect 14 and second interconnect 15 are formed as next described. An interconnect material is deposited to bury at least first aperture 12 and second aperture 13, following which interconnect material that has formed at points other than aperture 12 and aperture 13 is removed.

As the interconnect material, no particular restrictions apply as long as the material realizes the functions of interconnects and is of the same type as metal used in the interconnects of integrated circuits of the related art. In particular, interconnects that contain at least one of the metals titanium and tantalum exhibited good compatibility with other interconnects. An interconnect realized by a laminated film of at last one of the metals titanium and tantalum and the nitride of that metal also exhibited good compatibility with other interconnects.

A CMP (Chemical and Mechanical Polishing) method used in the interconnect formation steps of integrated circuits of the related art is ideal as the method of removing the interconnect material formed in points other than first aperture 12 and second aperture 13. Using a CMP method to polish the interconnect material until the upper surface of insulating layer 11 is exposed eliminates the interconnect material that has formed at points other than first aperture 12 and second aperture 13.

Figure 2F:
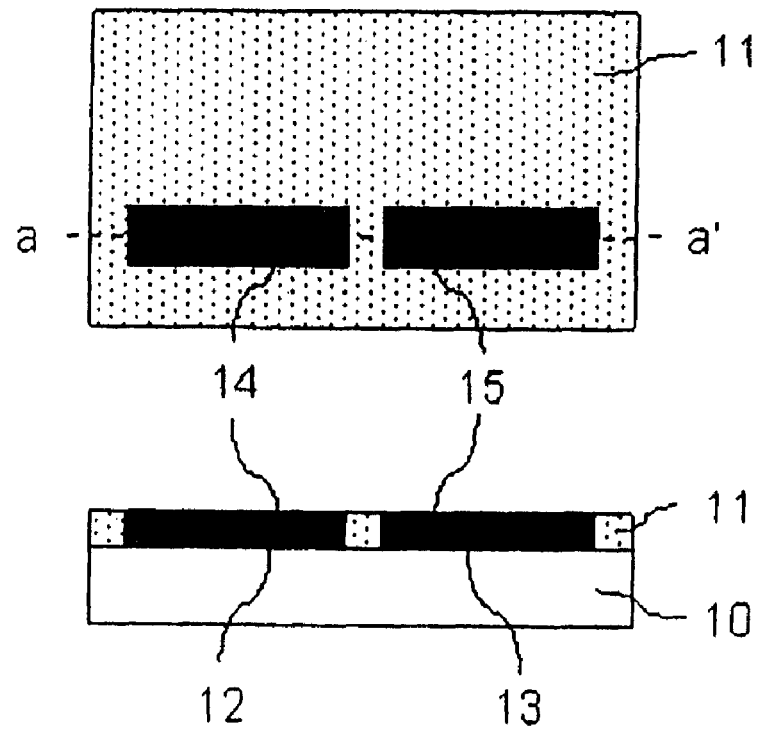
FIG. 2F is a sectional view showing the fabrication method of the solid electrolyte switching element of the first embodiment.

In this way, first interconnect 14 in which the interconnect material is embedded in first aperture 12 and second interconnect 15 in which the interconnect material is embedded in second aperture 13 are formed in insulating layer 11 as shown in FIG. 2F. First interconnect 14 and second interconnect 15 are separated by the above-described micro distance.

Solid electrolyte layer 16 is next formed in contact with first interconnect 14 and second interconnect 15 on insulating layer 11. After first forming a solid electrolyte layer by means of a laser deposition method or a sputtering method, unnecessary points are eliminated. The use of these methods keeps the film formation temperature of the solid electrolyte layer to no more than 350° C. The film thickness of solid electrolyte layer 16 should be on the order of 5-200 nm. The material of solid electrolyte layer 16 is preferably a compound of a metal or semiconductor and a chalcogen such as oxygen, sulfur, selenium, and tellurium. In particular, a sulfide, oxide, or oxysulfide of a metal such as copper, tungsten, tantalum, molybdenum, chromium, titanium and cobalt is ideal. An oxysulfide may have any sulfur-oxygen ratio.

After forming the solid electrolyte layer on insulating layer 11, a photoresist having a desired pattern is formed by a normal lithographic process. Dry etching or wet etching is next carried out to remove the unnecessary points of the solid electrolyte layer and thus form the pattern of solid electrolyte layer 16. The photoresist is then eliminated to complete the construction shown in FIG. 2G.

Figure 2G:
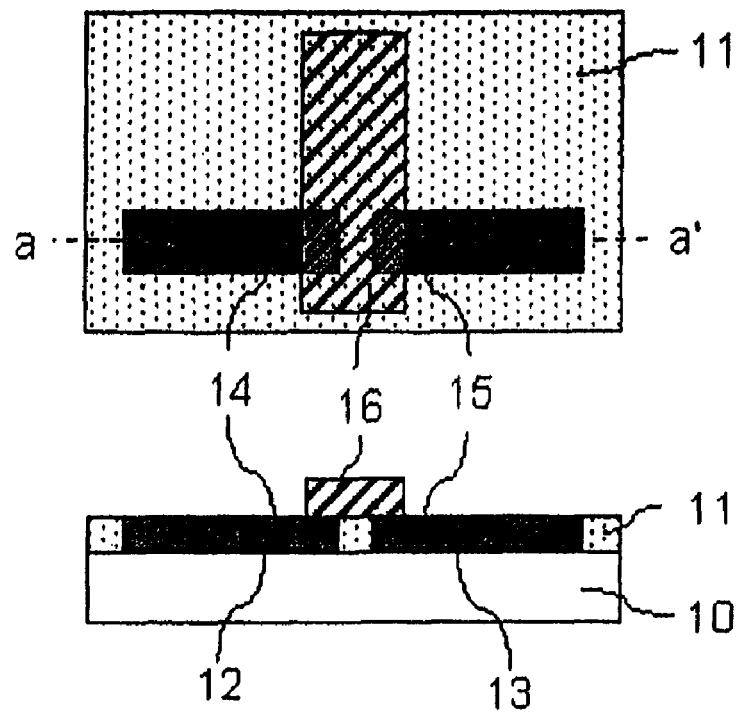
FIG. 2G is a sectional view showing the fabrication method of the solid electrolyte switching element of the first embodiment.
Figure 2H:
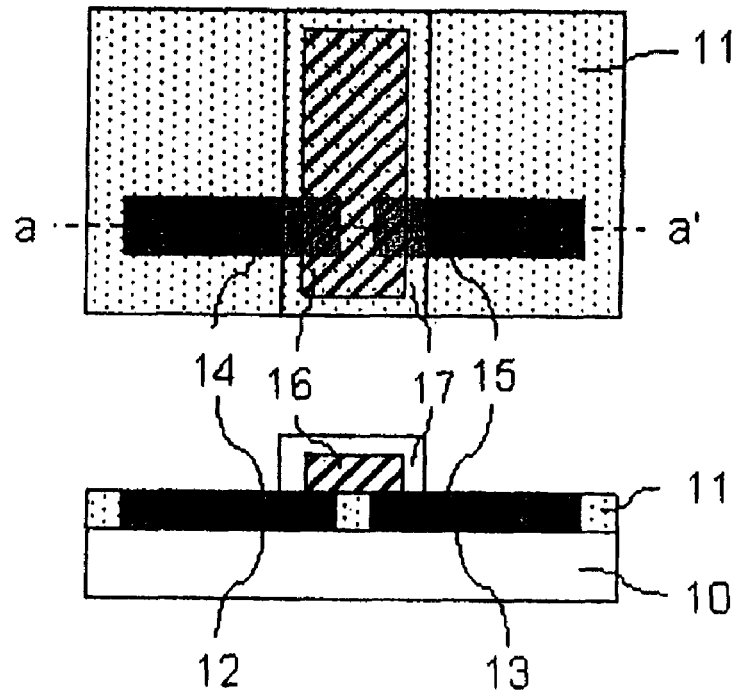
FIG. 2H is a sectional view showing the fabrication method of the solid electrolyte switching element of the first embodiment.
Figure 2I:
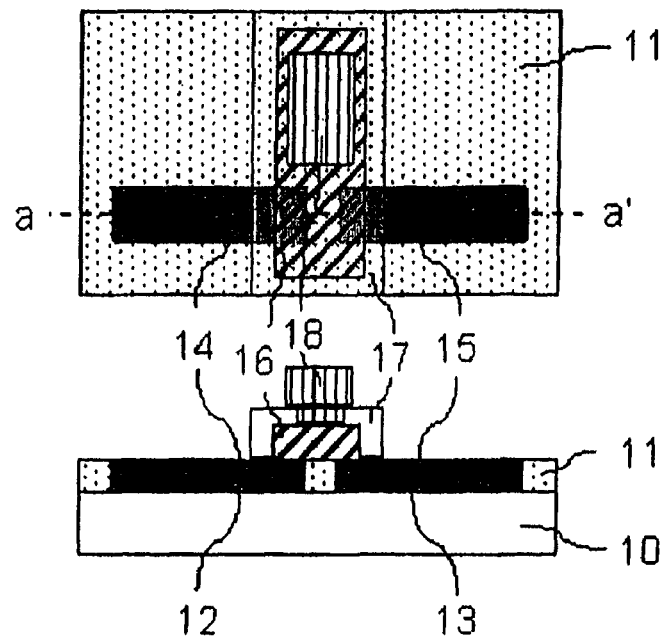
FIG. 2I is a sectional view showing the fabrication method of the solid electrolyte switching element of the first embodiment.

Metal diffusion prevention film 17 is next formed to cover solid electrolyte layer 16, following which metal diffusion prevention film 17 is patterned by means of a lithographic process and an etching process to form the construction shown in FIG. 2H. Metal diffusion prevention film 17 is here formed to cover solid electrolyte layer 16. Although a lithographic process and etching process are here carried out to pattern metal diffusion prevention film 17 and remove portions of metal diffusion prevention film that has been formed, metal diffusion prevention film 17 may be left on first interconnect 14 and second interconnect 15.

A photoresist having a prescribed aperture pattern is further formed by a lithographic process on metal diffusion prevention film 17. The aperture pattern is here located over solid electrolyte layer 16. Anisotropic etching is then carried out from over the photoresist to form an aperture in metal diffusion prevention film 17. After thus forming an aperture in metal diffusion prevention film 17 to expose a portion of the surface of solid electrolyte layer 16, the photoresist is removed.

Third interconnect 18 that contacts solid electrolyte layer 16 is next formed as follows. Copper or a metal that contains copper is used as the interconnect material, copper being used in this example. Copper is formed to a film thickness of 5-200 nm on at least solid electrolyte layer 16. Next, similar to the method of forming solid electrolyte layer 16, a photoresist having a desired pattern is formed on the copper by normal lithographic steps following which dry etching or wet etching is carried out to remove unnecessary points of copper and thus form third interconnect 18 on solid electrolyte layer 16. The photoresist is then removed to produce the construction shown in FIG. 2I. Regarding the distance from third interconnect 18 to first interconnect 14 and second interconnect 15, control is possible by setting the desired distance when forming the pattern of the photoresist corresponding to third interconnect 18 by lithographic steps. At this time, the photoresist pattern is set by taking into consideration the etching conversion differential, which is the dimensional differential when transferring the photoresist pattern to the copper.

Solid electrolyte switching element 1 shown in FIGS. 1A and 1B is produced by the above-described fabrication method that allows the formation of first interconnect 14 and second interconnect 15 separated by a distance smaller than the minimum value of the limits of lithography. In addition, the fabrication method enabled control of the distances from third interconnect 18 to first interconnect 14 and second interconnect 15 in the lithographic steps.

Figure 3:
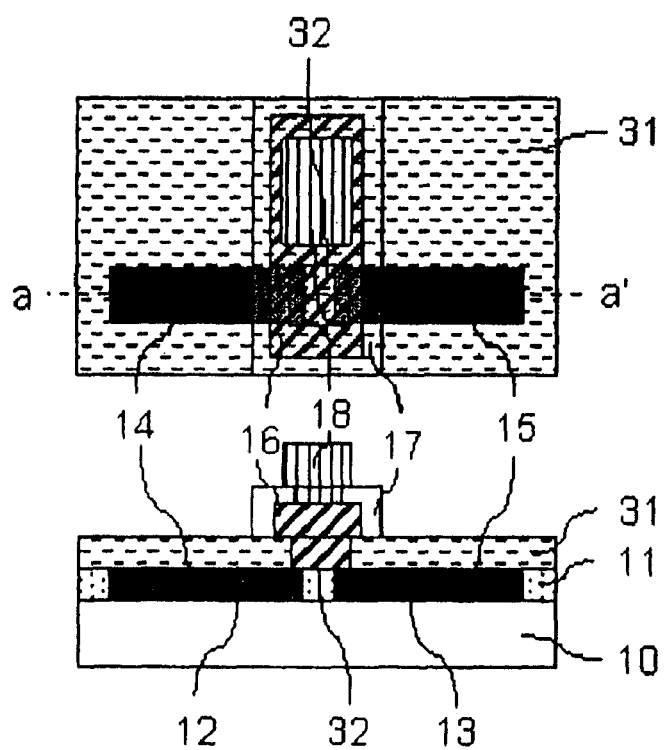
FIG. 3 is a plan view and a sectional view showing another example of the configuration of the solid electrolyte switching element of the first embodiment.

Explanation next regards another example of the configuration of the solid electrolyte switching element of the present embodiment. FIG. 3 is a plan view and a sectional view showing another example of the configuration of the solid electrolyte switching element in the present embodiment. In addition, components identical to those of the solid electrolyte switching element shown in FIGS. 1A and 1B are given the same reference numbers, and detailed explanation of these components is here abbreviated. Although third interconnect 18 is not arranged in the a-a' portion of FIG. 3, third interconnect 18 is displayed provided by way of the aperture of metal diffusion prevention film 17 in the sectional view of FIG. 3 for the purpose of explanation as in FIGS. 1A and 1B.

In solid electrolyte switching element shown in FIG. 3, second insulating layer 31 is formed between insulating layer 11 and solid electrolyte layer 16. Fourth aperture 32 that is to serve as the aperture for placing solid electrolyte layer 16 in contact with first interconnect 14 and second interconnect 15 is provided on second insulating layer 31. Solid electrolyte layer 16 formed on second insulating layer 31 contacts first interconnect 14 and second interconnect 15 by way of aperture 32. In the solid electrolyte switching element shown in FIG. 3, the area in which metal can be precipitated by metal ions supplied from third interconnect 18 is limited to a solid electrolyte layer in fourth aperture 32. This form therefore enables a switching operation from the OFF state to the ON state by the minimum amount of precipitated metal, whereby more stable operation of the solid electrolyte switching element can be achieved.

The following brief explanation relates to the fabrication method of the solid electrolyte switching element shown in FIG. 3. The formation of first interconnect 14 and second interconnect 15 as shown in FIG. 2F is followed by the formation of second insulating layer 31, which is a metal diffusion prevention film. A resist pattern having a prescribed aperture is then formed by a lithographic step. At this time, the aperture position is set to overlap with a portion of each of first interconnect 14 and second interconnect 15. Anisotropic etching is then carried out from above the resist pattern to form fourth aperture 32 in second insulating layer 31. The formation of fourth aperture 32 exposes a portion of the surface of first interconnect 14 and second interconnect 15.

The photoresist is then removed to complete the formation of solid electrolyte layer 16 as shown in FIG. 2G.

Second Embodiment

Figure 4A:
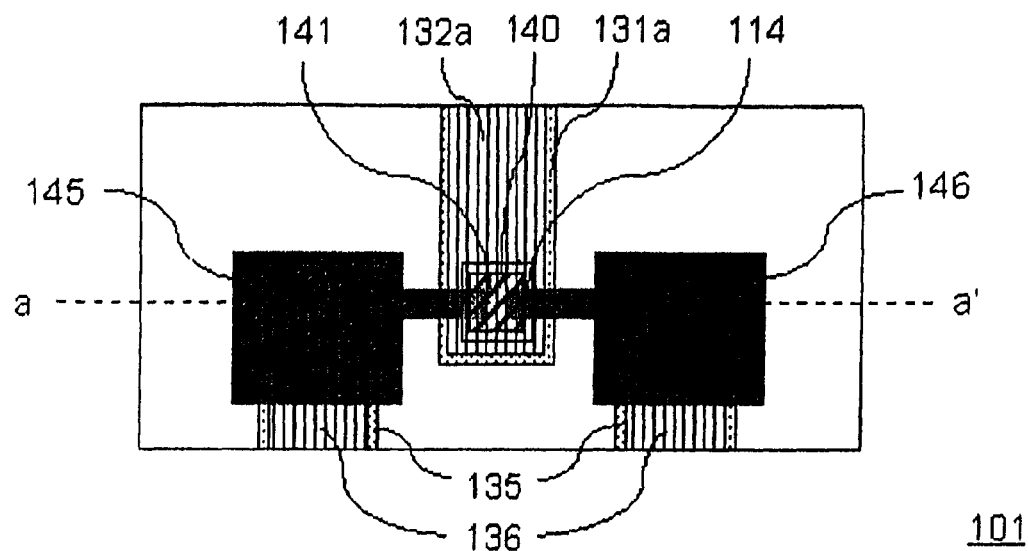
FIG. 4A is a plan view showing an example of the configuration of the solid electrolyte switching element of the second embodiment.
Figure 4B:
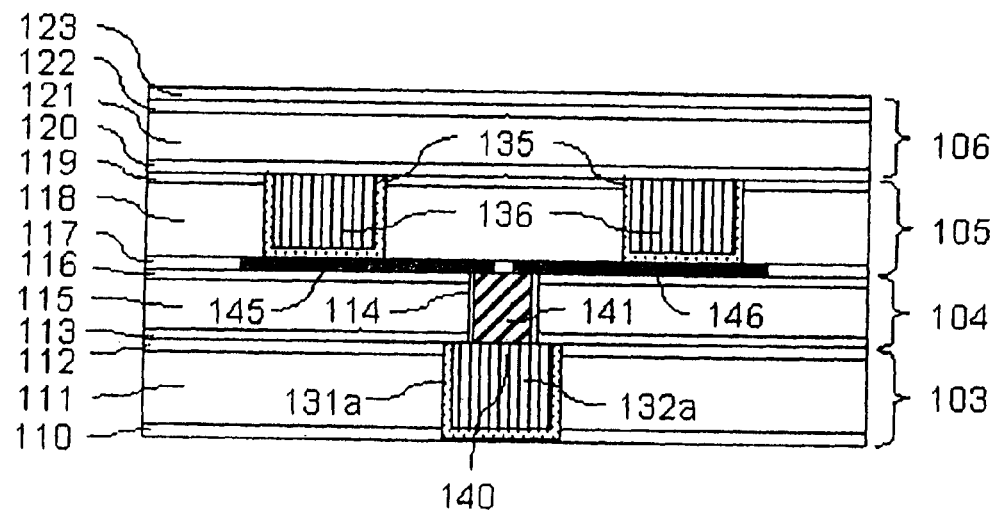
FIG. 4B is a sectional view showing an example of the configuration of the solid electrolyte switching element of the second embodiment.

Explanation next regards the configuration of the solid electrolyte switching element of the present embodiment. FIGS. 4A and 4B show an example of the configuration of the solid electrolyte switching element of the present embodiment. FIG. 4A is a plan view and FIG. 4B is a sectional view taken along broken line a-a' shown in FIG. 4A.

As shown in FIGS. 4A and 4B, solid electrolyte switching element 101 is of a configuration that includes: a third interconnect provided on first interconnect layer 103, solid electrolyte layer 141 provided on first insulating layer 104, and first interconnect 145 and second interconnect 146 provided on second interconnect layer 105. First interconnect layer 103, first insulating layer 104, and second interconnect layer 105 are formed successively.

First interconnect layer 103 is realized by the successive formation of first protective insulating film 110, interlayer insulating film 111, and stopper insulating film 112. The third interconnect, which serves as an anode that supplies metal ions, is of a configuration that includes copper 132a and barrier metal 131a for preventing the diffusion of copper. The side walls and bottom surface of copper 132a are covered by barrier metal 131a. In addition, the third interconnect is formed of copper 132a and barrier metal 131a, but because copper 132a realizes the key role in the solid electrolyte switching element, the third interconnect is hereinbelow indicated by reference number 132a. As barrier metal 131a, a material that contains at least any one of titanium, titanium nitride, tantalum, and tantalum nitride is preferable because these materials prevent the diffusion of copper. Accordingly, barrier metal 131a not only serves the function of an interconnect for conducting electrons, but also serves the function of a metal diffusion prevention film.

First insulating layer 104 is realized by the successive formation of second protective insulating film 113, second interlayer insulating film 115, and second stopper insulating film 116. Solid electrolyte layer 141 contacts third interconnect 132a by way of third aperture 140, which is an aperture provided in second protective insulating film 113. The side walls of solid electrolyte layer 141 are covered by cover insulation film 114 that functions as a metal diffusion prevention film.

Second interconnect layer 105 is realized by the successive formation of third protective insulating film 117 that serves the function of a metal diffusion prevention film, third interlayer insulating film 118, and third stopper insulating film 119. First interconnect 145 and second interconnect 146 are formed on third protective insulating film 117. First interconnect 145 and second interconnect 146 are arranged separated by a prescribed distance, and both interconnects contact solid electrolyte layer 141. The distance between first interconnect 145 and second interconnect 146 is a dimension smaller than the minimum value of the limits of lithography, as in the first embodiment. More specifically, this distance is on the order of 30-15 nm. Lead-out interconnects are provided on third interlayer insulating film 118 and third stopper insulating film 119 to lead out first interconnect 145 and second interconnect 146. The lead-out interconnects are of a construction that includes copper 136 and barrier metal 135 for preventing the diffusion of copper. The side walls and bottom surface of copper 136 are covered by barrier metal 135.

The thickness of first interconnect layer 104 is greater than the distance between first interconnect 145 and second interconnect 146. In addition, points of solid electrolyte layer 141 that do not contact any of first interconnect 145, second interconnect 146, and the third interconnect are covered by either one of cover insulation film 114 and third protective insulating film 117.

Solid electrolyte 141 is embedded in a multilayer insulating film in which second protective insulating film 113, second interlayer insulating film 115, and second stopper insulating film 116 are stacked. Third interconnect 132a is embedded in a multilayer insulating film in which first protective insulating film 110, interlayer insulating film 111, and stopper insulating film 112 are stacked.

The operation of solid electrolyte switching element 101 of the present embodiment is the same as that of the first embodiment and a detailed explanation of the operation is therefore here omitted.

In solid electrolyte switching element 101 shown in FIGS. 4A and 4B, first interconnect 145 that serves as the source electrode and second interconnect 146 that serves as the drain electrode are separated by the above-described micro distance. This distance is sufficiently smaller than the distance between third interconnect 132a that serves as the gate electrode that supplies metal ions and each of first interconnect 145 and second interconnect 146, i.e., the height of via layer 104, whereby greater stability is achieved in the operation of the solid electrolyte switching element.

In addition, points of solid electrolyte layer 141 that do not contact any of first interconnect 145, second interconnect 146, and the third interconnect are covered by a metal diffusion prevention film constituted by either of cover insulation film 114 and third protective insulating film 117, and metal ions therefore are not diffused to the surroundings. As a result, metal ions can be prevented from adversely affecting neighboring elements, and the solid electrolyte switching element of the present embodiment can be used in circuits that are integrated with other elements.

Explanation next regards a configuration in which solid electrolyte switching element 101 shown in FIGS. 4A and 4B is applied to an integrated circuit. A via construction for interconnecting semiconductor circuits is here shown as one part of the integrated circuit.

Figure 5:
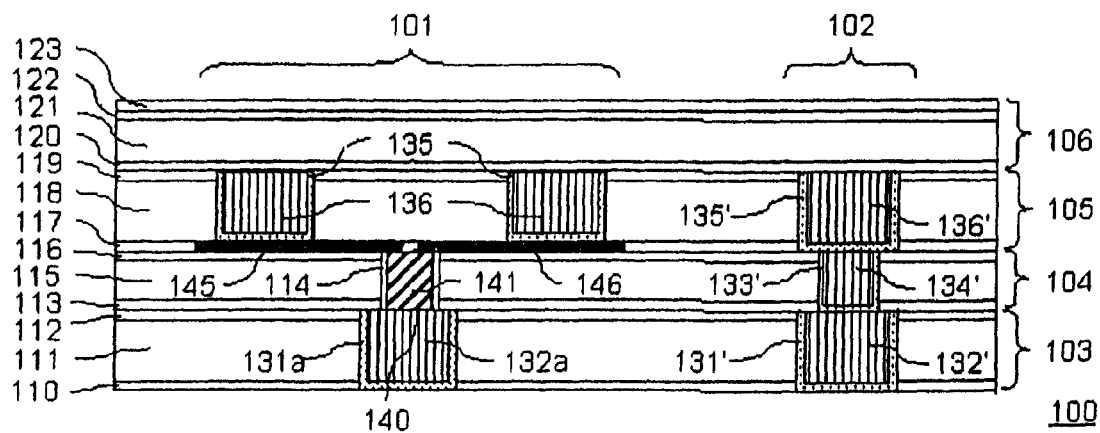
FIG. 5 is a sectional view of an integrated circuit that includes the solid electrolyte switching construction of the second embodiment and a via construction.

FIG. 5 is a sectional view showing the solid electrolyte switching element and the via construction. Components of the construction that are identical to elements shown in FIGS. 4A and 4B are given the same reference numerals and detailed explanation of these components is here omitted.

As shown in FIG. 5, the integrated circuit is of a configuration that includes solid electrolyte switching element 101 and via construction 102 for connecting together the interconnects. Via construction 102 includes: first circuit interconnect provided on first interconnect layer 103, second circuit interconnect provided on second interconnect layer 105, and a viaplug for connecting the first circuit interconnect and the second circuit interconnect. The viaplug is formed on first insulating layer 104. The layer in which this viaplug is formed is referred to as the "via layer."

The first circuit interconnect includes copper 132' and barrier metal 131' for preventing the diffusion of copper. The bottom surface and side walls of copper 132' are covered by barrier metal 131'. This copper 132' is of the same material as copper 132a of the third interconnect, and barrier metal 131' is of the same material as barrier metal 131a of the third interconnect.

The viaplug includes copper 134' and barrier metal 133' for preventing the diffusion of copper. The bottom surface and side walls of copper 134' are covered by barrier metal 133'.

Second circuit interconnect includes copper 136' and barrier metal 135' for preventing the diffusion of copper. The bottom surface and side walls of copper 136' are covered by barrier metal 135'. This copper 136' is of the same material as copper 136 of the lead-out interconnect, and barrier metal 135' is of the same material as barrier metal 135 of the lead-out interconnect.

The integrated circuit shown in FIG. 5 is of a construction in which the processing of a portion of the multilayer interconnects can be shared in the fabrication method of solid electrolyte switching element 101 and via construction 102.

In the configuration shown in FIGS. 4A, 4B and 5, first interconnect layer 103 and second interconnect layer 105 are taken as the interconnect layer in an integrated circuit, but these layers may be the via layer as well. In other words, a solid electrolyte switching element may be formed to correspond to a construction made up from two via layers and an interconnect layer between these two layers.

Explanation next regards the fabrication method of the solid electrolyte switching element and via construction shown in FIG. 5.

Figure 6A:
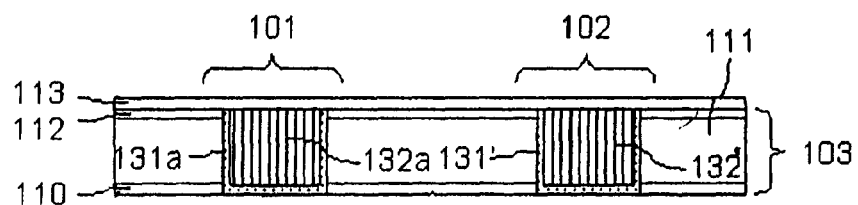
FIG. 6A is a sectional view showing the fabrication method of the solid electrolyte switching element of the second embodiment.
Figure 6B:
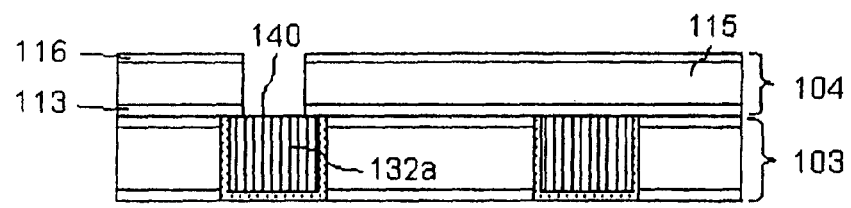
FIG. 6B is a sectional view showing the fabrication method of the solid electrolyte switching element of the second embodiment.
Figure 6C:
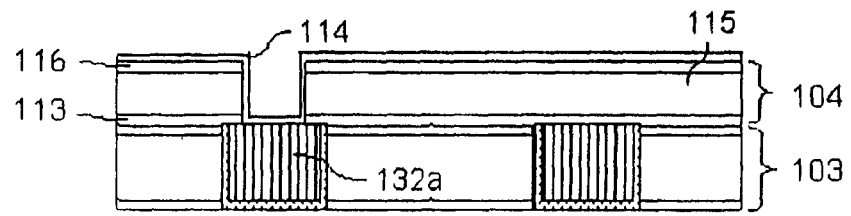
FIG. 6C is a sectional view showing the fabrication method of the solid electrolyte switching element of the second embodiment.
Figure 6D:
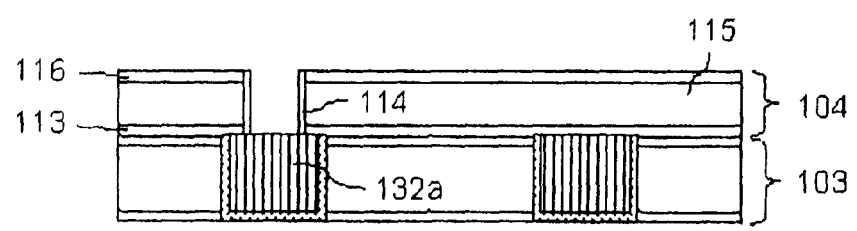
FIG. 6D is a sectional view showing the fabrication method of the solid electrolyte switching element of the second embodiment.
Figure 6E:
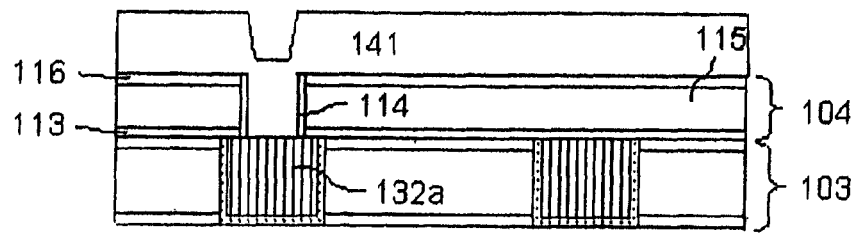
FIG. 6E is a sectional view showing the fabrication method of the solid electrolyte switching element of the second embodiment.
Figure 6F:
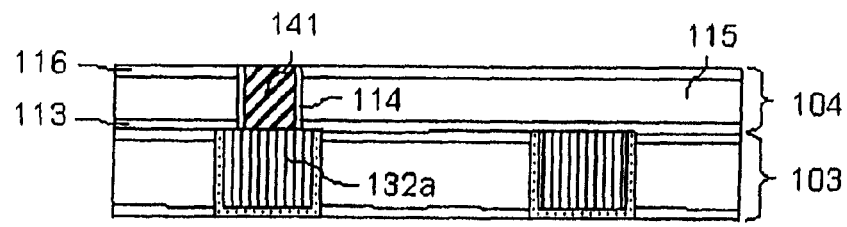
FIG. 6F is a sectional view showing the fabrication method of the solid electrolyte switching element of the second embodiment.
Figure 6G:
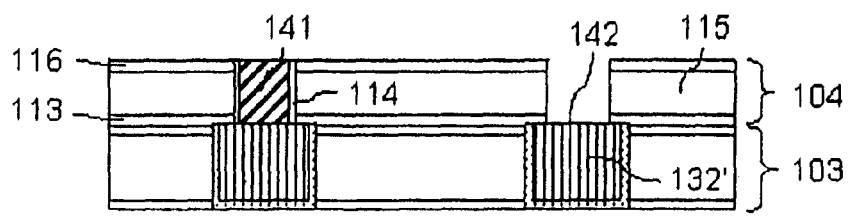
FIG. 6G is a sectional view showing the fabrication method of the solid electrolyte switching element of the second embodiment.
Figure 6H:
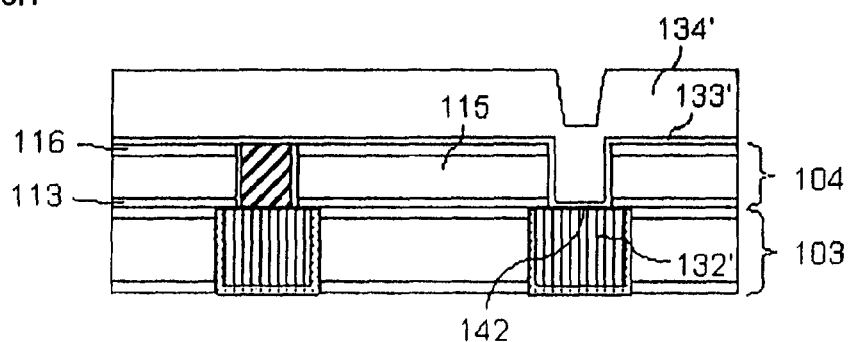
FIG. 6H is a sectional view showing the fabrication method of the solid electrolyte switching element of the second embodiment.
Figure 6I:
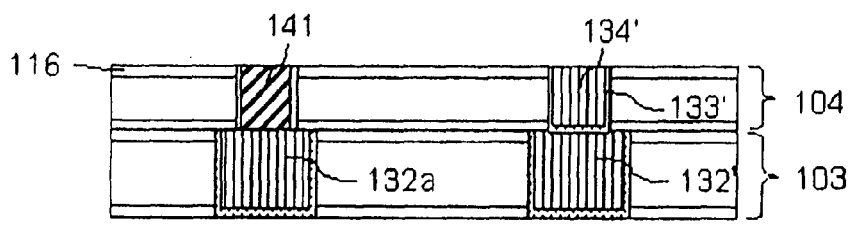
FIG. 6I is a sectional view showing the fabrication method of the solid electrolyte switching element of the second embodiment.
Figure 6J:
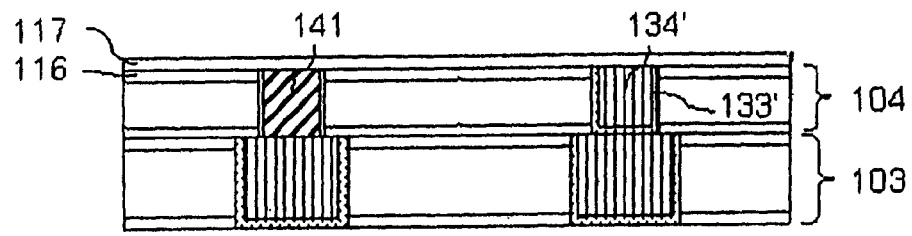
FIG. 6J is a sectional view showing the fabrication method of the solid electrolyte switching element of the second embodiment.
Figure 6K:
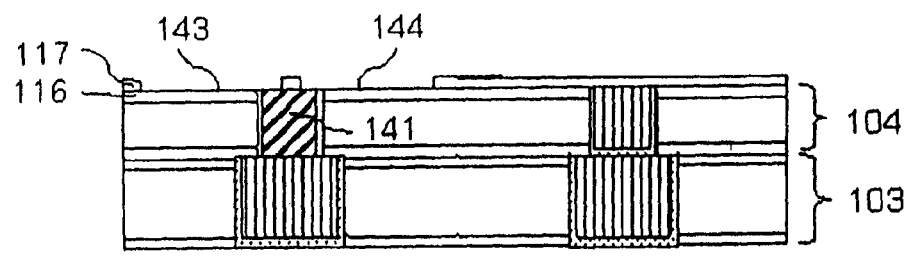
FIG. 6K is a sectional view showing the fabrication method of the solid electrolyte switching element of the second embodiment.
Figure 6L:
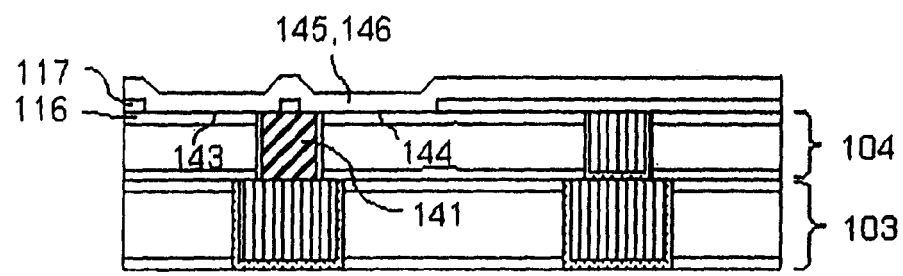
FIG. 6L is a sectional view showing the fabrication method of the solid electrolyte switching element of the second embodiment.
Figure 6M:
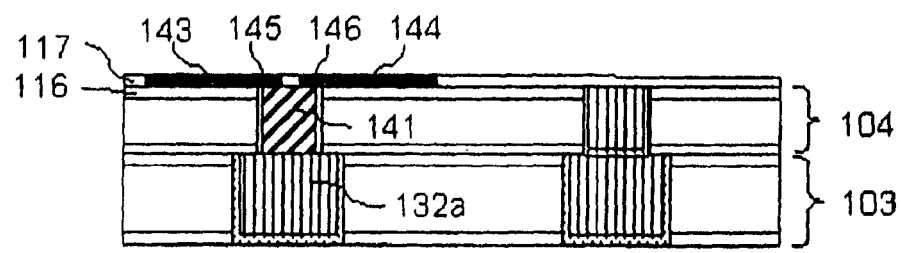
FIG. 6M is a sectional view showing the fabrication method of the solid electrolyte switching element of the second embodiment.
Figure 6N:
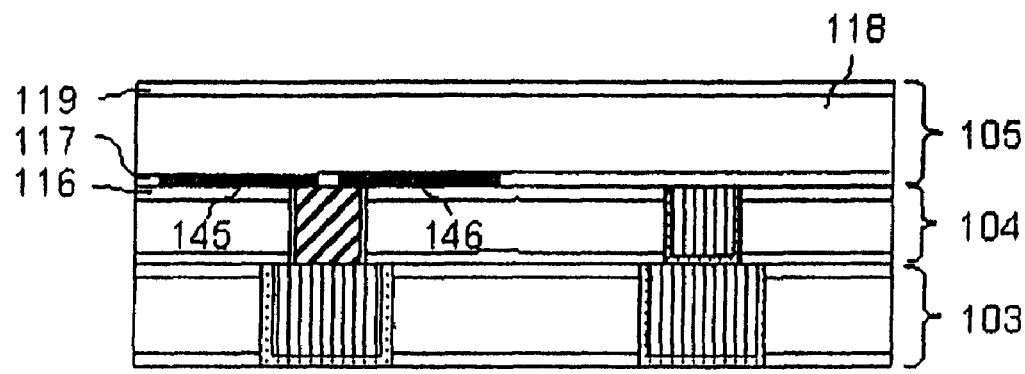
FIG. 6N is a sectional view showing the fabrication method of the solid electrolyte switching element of the second embodiment.
Figure 6O:
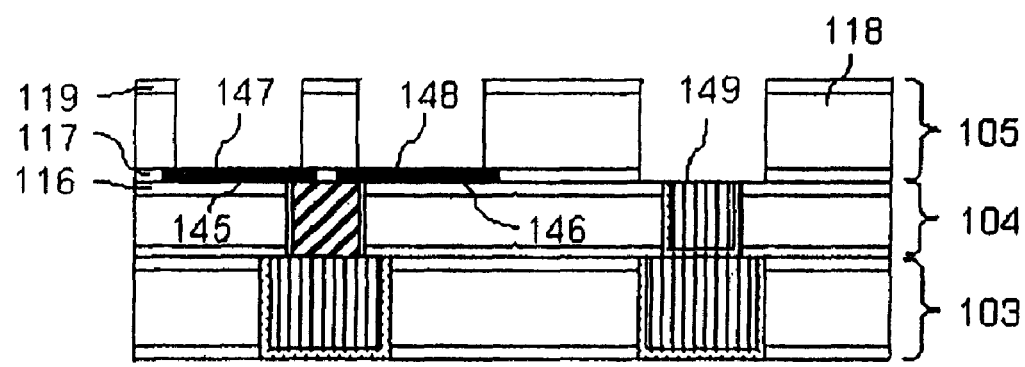
FIG. 6O is a sectional view showing the fabrication method of the solid electrolyte switching element of the second embodiment.
Figure 6P:
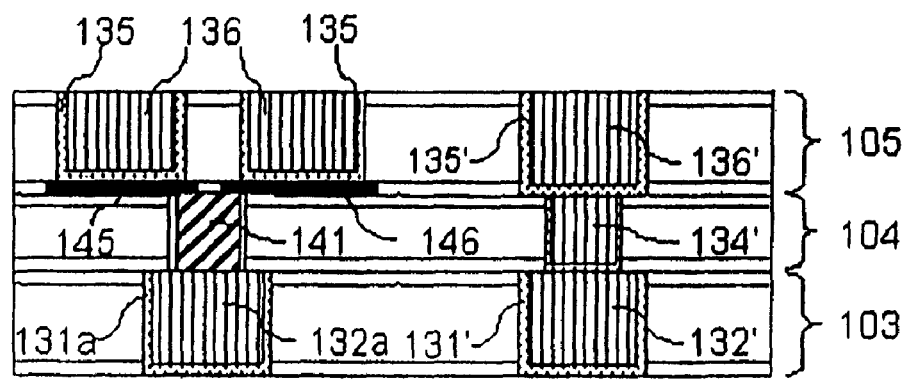
FIG. 6P is a sectional view showing the fabrication method of the solid electrolyte switching element of the second embodiment.

FIGS. 6A to 6P are sectional views showing the fabrication method of the solid electrolyte switching element and via construction.

First interconnect layer 103 is formed as described below.

First protective insulating film 110 for protecting an interconnect that is formed underneath (not shown), first interlayer insulating film 111 that is a film having a low dielectric constant, and first stopper insulating film 112 are deposited successively. The material of first protective insulating film 110 is preferably a material that suppresses the diffusion of copper into the oxide film, such as silicon nitride or a material in which any amount of carbon is mixed into the film. This first protective insulating film 110, in addition to the effect of suppressing the diffusion of copper into an oxide film, also has the effect of maintaining resistance to hydrogen annealing with respect to solid electrolyte layer 141, which is to be described hereinbelow. The film thickness may be on the order of 20-100 nm.

First interlayer insulating film 111 is a compound of silicon and oxygen, and is preferably a low-dielectric constant insulating film to which any amount of any of hydrogen, fluorine, and carbon has been added. A film containing holes is even more preferable. It is known that the dielectric constant of a film is further reduced when the film contains holes. The size of the holes is preferably no greater than 2 nm. The film thickness of first interlayer insulating film 111 is on the order of 50-250 nm. First stopper insulating film 112 may be a silicon oxide film, and may have a film thickness on the order of 50-200 nm. First stopper insulating film 112 serves the purpose of detecting the endpoint of CMP and protecting first interlayer insulating film 111 during CMP.

Apertures are formed in first protective insulating film 110, first interlayer insulating film 111, and first stopper insulating film 112 as described hereinbelow. A photoresist is applied to first stopper insulating film 112 and an exposure process then carried out. A developing process is carried out upon the exposed photoresist to form a photoresist having openings. Etching is then carried out through this photoresist to form apertures. For example, in 90 nm-generation lithography, the diameter of the aperture is on the order of 80-200 nm.

After the photoresist is removed, the barrier metal and a copper seed layer that is a portion of the copper are formed by a sputtering method in the aperture that has been formed. Barrier metal 131a and barrier metal 131' are of the same type of material. Barrier metal 131a and 131' are laminated films of tantalum nitride and tantalum and are formed to cover the bottom surface and side walls of the aperture. Barrier metal 131a and 131' prevent the diffusion of copper into first interlayer insulating film 111. The film thickness of the tantalum nitride and tantalum is on the order of 5-30 nm. The thickness of the copper seed layer is on the order of 20-100 nm.

Copper is next formed on the copper seed layer by a plating method. Copper 132a and copper 132' are formed in the same step. The film thickness of the copper is on the order of 300-800 nm. The barrier metal and copper on first stopper insulating film 112 are next polished by a CMP method to remove the unnecessary barrier metal and copper that are outside the aperture.

In this way, first interconnect layer 103 is formed in which barrier metal 131a and 131' and copper 132a and 132' are embedded in apertures provided in first protective insulating film 110, first interlayer insulating film 111, and first stopper insulating film 112. Third interconnect composed of barrier metal 131a and copper 132a is formed in the solid electrolyte switching element formation region, and first circuit interconnect composed of barrier metal 131' and copper 132' is formed in the via construction formation region. Second protective insulating film 113 is then formed on first interconnect layer 103 (FIG. 6A). Second protective insulating film 113 serves the same role effected by first protective insulating film 110 and is therefore of the same construction as first protective insulating film 110. The film thickness is 20-100 nm.

Second interlayer insulating film 115 and second stopper insulating film 116 are next formed successively on second protective insulating film 113 to form first insulating layer 104 that is composed of second protective insulating film 113, second interlayer insulating film 115 and second stopper insulating film 116. The film thickness of second interlayer insulating film 115 is on the order of 50-250 nm. Second interlayer insulating film 115 serves the same role as first interlayer insulating film 111 and is therefore of the same construction as first interlayer insulating film 111. Second stopper insulating film 116 serves the same role as first stopper insulating film 112 and is therefore of the same construction as first stopper insulating film 112. The film thickness is on the order of 50-200 nm.

Third aperture 140 is formed as next described. A photoresist is applied to second stopper insulating film 116, following which an exposure process is carried out. The exposed photoresist is then subjected to a developing process to form a photoresist having an aperture. Etching is then carried out through the photoresist to form third aperture 140 in first insulating layer 104 (FIG. 6B). In 90-nm generation lithographic technology, the diameter of third aperture 140 is on the order of 80-200 nm.

Cover insulation film 114 is next deposited to completely cover the side walls and bottom surface of third aperture 140 (FIG. 6C). Cover insulation film 114 should be a film that serves the same role as first protective insulating film 110 and is therefore of the same construction as first protective insulating film 110. The film thickness is 10-50 nm.

Etching having high anisotropy is further implemented to remove cover insulation film 114 that has been formed on second stopper insulating film 116 and on the bottom surface of third aperture 140. A dry etching method such as reactive ion etching is effective as an etching having high anisotropy. Cover insulation film 114 is thus formed that completely covers only the side walls of third aperture 140 (FIG. 6D).

Next, as shown in FIG. 6E, solid electrolyte layer 141 is formed to completely bury third aperture 140. The material and formation method of solid electrolyte layer 141 is the same as in the first embodiment. The film thickness of solid electrolyte layer 141 that is formed to bury third aperture 140 is set to at least the total film thickness of first insulating layer 104 that is made up from second protective insulating film 113, second interlayer insulating film 115, and second stopper insulating film 116. The film thickness of first insulating layer 104 is on the order of 100-400 nm. The material of solid electrolyte layer 141 is the same as in the first embodiment. The film formation temperature is no greater than 350° C.

Of solid electrolyte layer 141 that has been formed, unnecessary solid electrolyte layer 141 that is outside third aperture 140 is removed by a CMP method. In this way, solid electrolyte layer 141 is embedded in cover insulation film 114 in third aperture 140 provided in first insulating layer (via layer) 104 that is made up from second protective insulating film 113, second interlayer insulating film 115, and second stopper insulating film 116 (FIG. 6F). As described hereinabove, the height of solid electrolyte layer 141 is 100-400 nm.

A viaplug is next formed on first insulating layer (via layer) 104 as described hereinbelow. A photoresist is applied to second stopper insulating film 116 and then subjected to an exposure process. The exposed photoresist is then subjected to a development process to form a photoresist having an aperture. Etching is then carried out through this photoresist to form aperture 142 in first insulating layer 104 as shown in FIG. 6G (FIG. 6G). In 90-nm generation lithographic technology, the diameter of aperture 142 is on the order of 80-200 nm.

Barrier metal 133' and a copper seed layer that is to be one portion of copper 134' is formed by a sputtering method in aperture 142 that has been formed. The barrier metal is a laminated construction of tantalum nitride and tantalum and is formed to cover the bottom surface and side walls of aperture 142. The barrier metal serves the role of preventing the diffusion of copper into first insulating layer 104. The film thickness of tantalum nitride and tantalum is on the order of 5-30 nm. The film thickness of the copper seed layer is on the order of 20-100 nm. Copper plating is then carried out (FIG. 6H). The film thickness of the copper is on the order of 300-800 nm.

Unnecessary barrier metal and copper outside aperture 142 are next removed by a CMP method, whereby a viaplug composed of barrier metal 133' and copper 134' is formed in first insulating layer 104 (FIG. 6I).

Third protective insulating film 117 is then formed on first insulating layer 104 as shown in FIG. 6J. Third protective insulating film 117 should be a film that serves the same role as first protective insulating film 110 and therefore has the same construction as first protective insulating film 110. The film thickness is 20-100 nm.

First aperture 143 and second aperture 144 are next formed separated by the above-described micro distance on third protective insulating film 117 as in the first embodiment (FIG. 6K). When first aperture 143 and second aperture 144 are formed, a portion of the surface of solid electrolyte 141 is exposed. The spacing of first aperture 143 and second aperture 144 can be made smaller than the minimum value of the limits of lithography and is formed on the order of 30-15 nm by optimizing conditions.

First interconnect 145 and second interconnect 146 are formed as described below. Interconnect material is deposited to cover first aperture 143, second aperture 144, and third protective insulating film 117 (FIG. 6L). As the interconnect material, no particular restrictions are placed on the type of material as long as the material is a metal of the same type used in interconnects of integrated circuits of the related art and achieves functionality as an interconnect. An interconnect that contains at least one of the metals titanium and tantalum has compatibility with other interconnects. Alternatively, an interconnect realized by a laminated film of at least one of the metals titanium and tantalum and the nitride of that metal has compatibility with other interconnects. Interconnect material that has formed at points other than first aperture 143 and second aperture 144 is next removed by a CMP method, whereby first interconnect 145 and second interconnect 146 are formed that are arranged separated by the above-described micro distance on third protective insulating film 117 (FIG. 6M).

Second interconnect layer 105 is formed as next described. Third interlayer insulating film 118 and third stopper insulating film 119 are successively deposited on third protective insulating film 117 (FIG. 6N). The film thickness of third interlayer insulating film 118 is on the order of 50-250 nm. Third interlayer insulating film 118 serves the same role as first interlayer insulating film 111 and therefore is of the same construction as first interlayer insulating film 111. Third stopper insulating film 119 serves the same role as first stopper insulating film 112 and therefore is of the same construction as first stopper insulating film 112. The film thickness is on the order of 50-200 nm.

A photoresist is then applied to third stopper insulating film 119 and then subjected to an exposure process. The exposed photoresist is then subjected to a development process to form a photoresist that includes apertures. Etching is then carried out through this photoresist to form apertures in third interlayer insulating film 118 and third stopper insulating film 119 on first interconnect 145 and second interconnect 146 in the solid electrolyte switching element formation region. An aperture is also formed in third protective insulating film 117, third interlayer insulating film 118, and third stopper insulating film 119 in the via construction formation region (FIG. 6O). In 90-nm generation lithography, the diameter of the aperture is on the order of 80-200 nm. When forming the aperture, etching is carried out under the conditions for etching the insulating film, and the reduction of first interconnect 145 and second interconnect 146 is therefore suppressed.

After the photoresist has been removed, barrier metal and a copper seed layer that is a portion of the copper are formed by a sputtering method in the apertures that have been formed. Barrier metal 135 and barrier metal 135' are of the same type of material. Barrier metal 135 and 135' are laminated films of tantalum nitride and tantalum, and are formed to cover the bottom surfaces and side walls of the apertures. Barrier metal 135 and 135' prevent the diffusion of copper into third interlayer insulating film 118. The film thickness of the tantalum nitride and tantalum is on the order of 5-30 nm. The thickness of the copper seed layer is on the order of 20-100 nm.

Copper is next formed by a plating method on the copper seed layer. Copper 136 and 136' are formed by the same step. The film thickness of copper is on the order of 300-800 nm. The barrier metal and copper on third stopper insulating film 119 is next polished by a CMP method to remove unnecessary barrier metal and copper that are outside the apertures. Second interconnect layer 105 is thus formed with lead-out interconnects composed of barrier metal 135 and copper 136 formed in the solid electrolyte switching element formation area and second circuit interconnect composed of barrier metal 135' and copper 136' formed in the via construction formation region (FIG. 6P).

Protective layer 106 composed of fourth protective insulating film 120, fourth interlayer insulating film 121, fourth stopper insulating film 122, and fifth protective insulating film 123 is next formed on second interconnect layer 105 as shown in FIG. 5. Fourth protective insulating film 120 and fifth protective insulating film 123 serve the same role as first protective insulating film 110 and are therefore of the same construction as first protective insulating film 110. The film thickness is on the order of 20-100 nm. Fourth interlayer insulating film 121 serves the same role as first interlayer insulating film 111 and is therefore of the same construction as first interlayer insulating film 111. The film thickness is on the order of 50-250 nm. Fourth stopper insulating film 122 serves the same role as first stopper insulating film 112 and is therefore of the same construction as first stopper insulating film 112. The film thickness is on the order of 50-200 nm.

Lead-out interconnects were formed on second interconnect layer 105 in the present embodiment, but the lead-out interconnects may also be formed on the layer of first insulating layer 104. Alternatively, lead-out interconnects may be formed on both second interconnect layer 105 and first insulating layer 104.

Solid electrolyte switching element 101 of the present embodiment was produced by means of the above-described fabrication method. The fabrication method can achieve an interconnect construction in which first interconnect 145 and second interconnect 146 are embedded in third protective insulating film 117 separated by a micro distance that surpasses the limits of lithography. The distance between third interconnect 132a that is the gate electrode and first interconnect 145 that is the source electrode and the distance between third interconnect 132a that is the gate electrode and second interconnect 146 that is the drain electrode are determined by the thickness of via layer 104, but these distances are sufficiently greater than the distance between the source electrode and drain electrode.

In the three-terminal solid electrolyte switching element 101 that employs the interconnect construction formed by the above-described method, the distance between the source electrode and drain electrode is sufficiently smaller than the distance between the gate electrode and source electrode (or the drain electrode), whereby stable switching operations can be repeated. Further, a construction in which a second insulating layer containing a fourth aperture is inserted between solid electrolyte layer 141 and third protective insulating film 117 in which first interconnect 145 and second interconnect 146 are embedded limits the region in which metal ions can precipitate to within the fourth aperture and is therefore effective for stabilizing switching operations.

Still further, starting with the step of forming third interconnect 132a, the large number of steps that can be shared with the multilayer interconnect fabrication steps, the minimization of the number of added masks to just two, the suppression of the diffusion of atoms into insulating films, and the measures taken for resistance to hydrogen annealing all enable the introduction to the production line with minimal additional costs. As has been made clear here, one skilled in the art of forming multilayered interconnects of integrated circuits of the related art would encounter no particular difficulty in carrying out the above-described steps without requiring special steps.

Third Embodiment

Explanation next regards the configuration of the solid electrolyte switching element of the present embodiment.

Figure 7A:
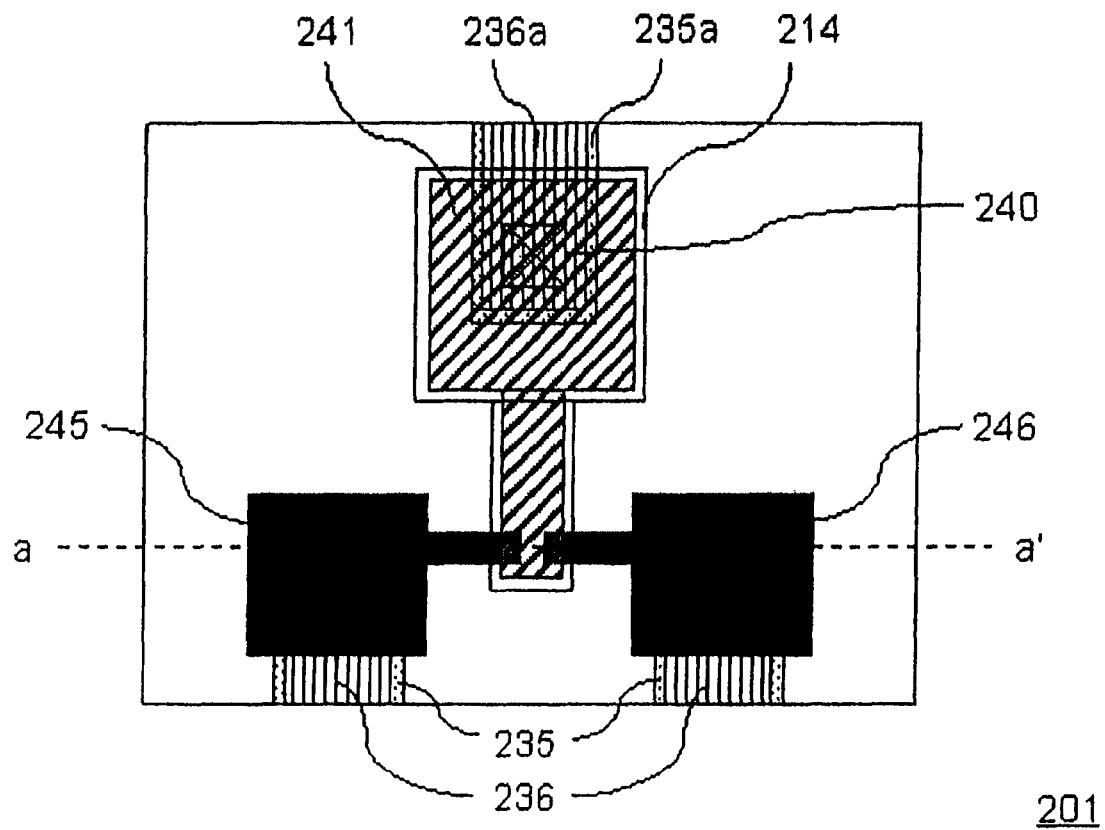
FIG. 7A is a plan view showing an example of the configuration of the solid electrolyte switching element of the third embodiment.
Figure 7B:
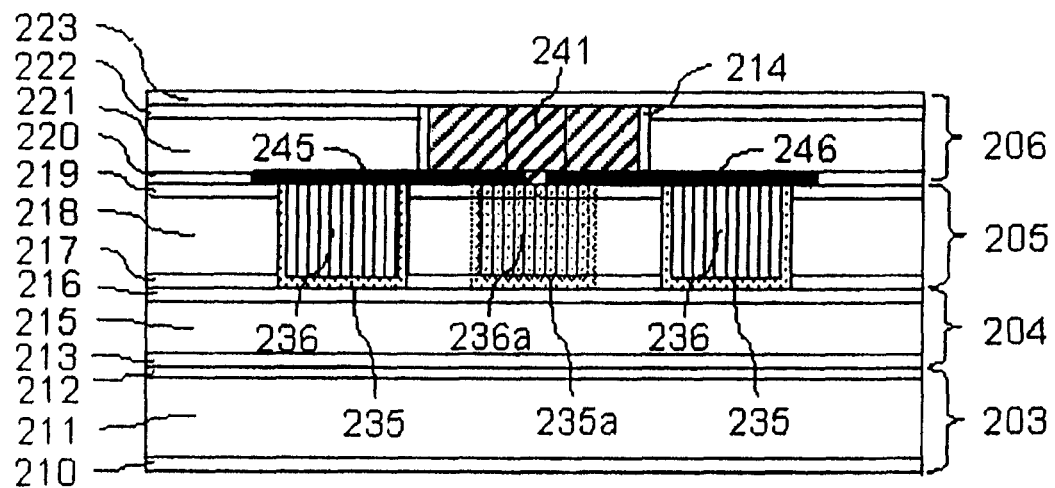
FIG. 7B is a sectional view showing an example of the configuration of the solid electrolyte switching element of the third embodiment.

FIGS. 7A and 7B show an example of the configuration of the solid electrolyte switching element of the present embodiment. FIG. 7A is a plan view, and FIG. 7B is sectional view taken along broken line a-a' shown in FIG. 7A.

In the construction shown in FIGS. 7A and 7B, first interconnect layer 203, first insulating layer 204, second interconnect layer 205, and protective layer 206 are formed successively on a substrate (not shown). The solid electrolyte switching element of the present embodiment is of a configuration that includes: first interconnect 245, second interconnect 246 and solid electrolyte layer 241 provided on protective layer 206, and third interconnect provided on second interconnect layer 205.

Protective layer 206 is of a configuration in which fourth protective insulating film 220, fourth interlayer insulating film 221, fourth stopper insulating film 222, and fifth protective insulating film 223 are successively formed. First interconnect 245 and second interconnect 246 are formed on fourth protective insulating film 220. First interconnect 245 and second interconnect 246 are arranged separated by a prescribed distance, and both interconnects contact solid electrolyte layer 241. As in the first embodiment, the distance between first interconnect 245 and second interconnect 246 is a dimension smaller than the minimum value of the limits of lithography. More specifically, this distance is on the order of 30-15 nm.

Solid electrolyte layer 241 is provided in fourth interlayer insulating film 221 and fourth stopper insulating film 222 and contacts first interconnect 245 and second interconnect 246. The side surfaces of solid electrolyte layer 241 are covered by cover insulation film 214, and the upper surface of solid electrolyte layer 241 is covered by fifth protective insulating film 223. In addition, points of the bottom surface of solid electrolyte layer 241 that do not contact either one of first interconnect 245 and second interconnect 246 are covered by fourth protective insulating film 220. Fourth protective insulating film 220, fifth protective insulating film 223, and cover insulation film 214 serve the function of a metal diffusion prevention film.

Second interconnect layer 25 is realized by the successive formation of third protective insulating film 217, third interlayer insulating film 218, and third stopper insulating film 219. The lead-out interconnects for leading out first interconnect 245 and second interconnect 246 are provided on third interlayer insulating film 281 and third stopper insulating film 219. The lead-out interconnects are of a construction that includes copper 236 and barrier metal 235 for preventing the diffusion of copper. The side walls and bottom surface of copper 236 are covered by barrier metal 235. In addition, a third interconnect is provided on third interlayer insulating film 218 and third stopper insulating film 219. The third interconnect is of a construction that includes copper 236a and barrier metal 235a for preventing the diffusion of copper. The side walls and bottom surface of copper 236a are covered by barrier metal 235a. Copper 236a of the third interconnect contacts solid electrolyte layer 241 by way of third aperture 240 provided in fourth protective insulating film 220. In addition, the third interconnect is formed by copper 236a and barrier metal 235a, but because copper 236a plays the key role in the solid electrolyte switching element, the third interconnect is indicated hereinbelow by just reference number 236a.

The distance from third interconnect 236a to first interconnect 245 and second interconnect 256 is made greater than the distance between first interconnect 245 and second interconnect 246. The distances between third interconnect 236a and first interconnect 245 and second interconnect 246 are set in the lithography step when third interconnect 236a is patterned.

First interconnect layer 203 is realized by the successive formation of protective insulating film 210, interlayer insulating film 211, and stopper insulating film 212. First insulating layer 204 is realized by the successive formation of second protective insulating film 213, second interlayer insulating film 215, and second stopper insulating film 216.

The operation of solid electrolyte switching element 201 of the present embodiment is the same as the case of the first embodiment, and a detailed explanation of this operation is therefore here omitted.

In solid electrolyte switching element 201 shown in FIGS. 7A and 7B, first interconnect 245 that serves as the source electrode and second interconnect 246 that serves as the drain electrode are separated by the above-described micro distance. This distance is smaller than the distance between third interconnect 236a that serves as the gate electrode that supplies metal ions and first interconnect 245 and second interconnect 246, whereby greater stability is achieved in the operation of the solid electrolyte switching element.

In addition, points of solid electrolyte layer 241 that do not contact any of first interconnect 245, second interconnect 246, and the third interconnect are covered by any of fourth protective insulating film 220, cover insulation film 214 and fifth protective insulating film 223, whereby metal ions do not diffuse to the surrounding areas. As a result, metal ions can be prevented from adversely affecting neighboring elements, and the solid electrolyte switching element of the present embodiment can be used in circuits that are integrated together with other elements.

Explanation next regards a configuration in which solid electrolyte switching element 201 shown in FIGS. 7A and 7B is applied to an integrated circuit. A via construction for connecting together semiconductor circuits is here shown as a part of the integrated circuit.

Figure 8:
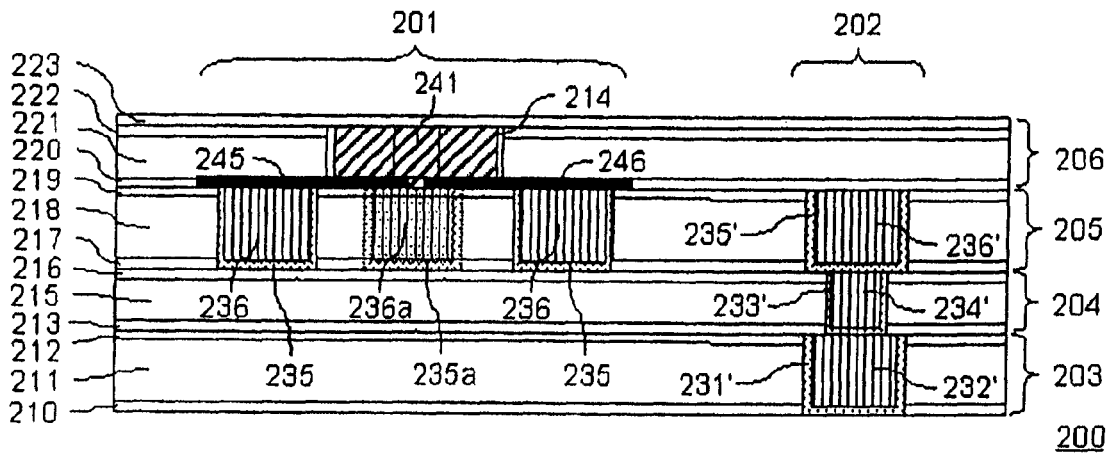
FIG. 8 is a sectional view of an integrated circuit that includes the solid electrolyte switching construction of the third embodiment and a via construction.

FIG. 8 is a sectional view showing a solid electrolyte switching element and a via construction. Components that are the same as components shown in FIGS. 7A and 7B are given the same reference numbers and detailed explanation of these components is omitted.

As shown in FIG. 8, the integrated circuit is of a configuration that includes solid electrolyte switching element 201 and via construction 202 for connecting together interconnects. Via construction 202 includes a first circuit interconnect provided in first interconnect layer 203, a second circuit interconnect provided in second interconnect layer 205, and a viaplug for connecting the first circuit interconnect and second circuit interconnect. The viaplug is formed in first insulating layer 204. The layer in which this viaplug is formed is referred to as the "via layer."

The first circuit interconnect includes copper 232' and barrier metal 231' for preventing the diffusion of copper. The bottom surface and side walls of copper 232' are covered by barrier metal 231'. The viaplug includes copper 234' and barrier metal 233' for preventing the diffusion of copper. The bottom surface and side walls of copper 234' are covered by barrier metal 233'. The second circuit interconnect includes copper 236' and barrier metal 235' for preventing the diffusion of copper. The bottom surface and side walls of copper 236' are covered by barrier metal 235'. This copper 236' is of the same material as copper 236 of the lead-out interconnects and copper 236a of the third interconnect, and barrier metal 235' is of the same material as barrier metal 235 of the lead-out interconnect and barrier metal 235a of the third interconnect.

The differences between the solid electrolyte switching element of the present embodiment and that of the second embodiment are the positional relationships in the multilayered interconnects between third interconnect 236a for supplying metal ions to solid electrolyte layer 241 and solid electrolyte layer 241 that is formed above this third interconnect 236a and first interconnect 245 and second interconnect 246 embedded in fourth protective insulating film 220.

In the second embodiment, the positional relationships are such that third interconnect 132a for supplying metal ions to solid electrolyte layer 141 and solid electrolyte layer 141 that is formed above this third interconnect 132a are in the same vertical axis as first interconnect 145 and second interconnect 146 that are embedded in third protective insulating film 117. In contrast, in the present embodiment, first interconnect 245 and second interconnect 246 that are embedded in fourth protective insulating film 220 are arranged below solid electrolyte layer 241, and further, are arranged at a point that is separated within the plane from third interconnect 236a that is similarly arranged below solid electrolyte layer 241.

In the present embodiment, the distance from third interconnect 236a to first interconnect 245 and second interconnect 246 can be set freely by the position of arrangement of third interconnect 236a. In contrast, in the second embodiment, the distance from third interconnect 132a to first interconnect 145 and second interconnect 146 is determined by the thickness of solid electrolyte layer 141.

Compared to the second embodiment, the solid electrolyte switching element of the present embodiment facilitates the control of the distances between third interconnect 236a and first interconnect 245 and second interconnect 246. Because metal ions supplied from third interconnect 236a diffuse over this distance, the switching characteristics can be determined by controlling this distance. The characteristics of a solid electrolyte switching element in an integrated circuit can therefore be controlled. In particular, making the distance between third interconnect 236a and first interconnect 245 and second interconnect 246 greater than in related art has proven effective for preventing the occurrence of switching from the OFF state to the ON state.

In addition, forming solid electrolyte layer 241 over first interconnect 245, second interconnect 246 and third interconnect 236a eliminates restrictions on the points at which elements can be formed within the interconnect layer and thus increases the degree of freedom of element formation. This increase in design freedom can be fully applied in the interconnect forming steps by dual damascene that has become mainstream in recent years. In particular, it is now possible to form elements after completing multilayer interconnect steps. This potential has led to both a reduction of the risks involved in introducing new materials as well as a reduction of costs.

Explanation next regards the fabrication method of the solid electrolyte switching element and via construction shown in FIG. 8.

FIGS. 9A to 9D are sectional views showing the fabrication method of the solid electrolyte switching element and via construction. Detailed explanation relating to steps common to the second embodiment is here abbreviated.

First interconnect layer 203 and first insulating layer 204 are formed on a substrate (not shown) in which an insulating film is formed on the uppermost layer. At this time, a first circuit interconnect is formed in first interconnect layer 203 and a viaplug is formed in first insulating layer (via layer) 204 in the formation region of via construction 202, as in the second embodiment.

Figure 9A:
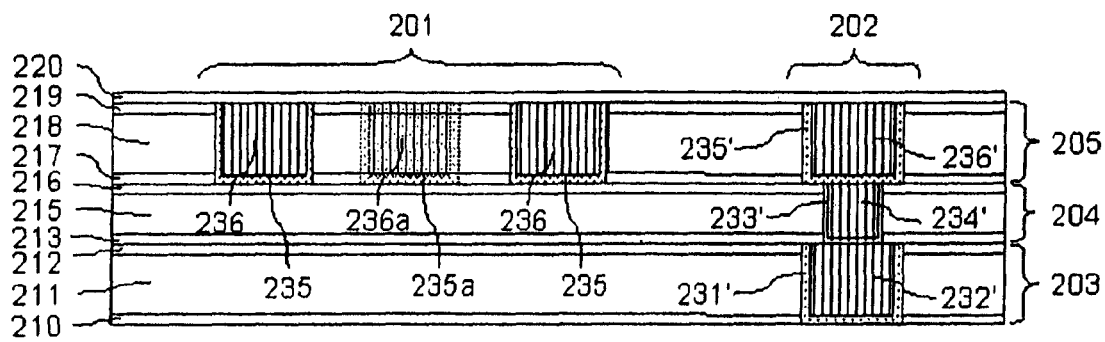
FIG. 9A is a sectional view showing the fabrication method of the solid electrolyte switching element of the third embodiment.

Second interconnect layer 205 is next formed similar to the method of forming second interconnect layer 105 of the second embodiment. At this time, a third interconnect is formed in addition to the lead-out interconnects in the formation region of solid electrolyte switching element 201. The method of forming this third interconnect is similar to that of the lead-out interconnects. Fourth protective insulating layer 220 is next formed over second interconnect layer 205 (FIG. 9A). Fourth protective insulating film 220 is formed from silicon nitride or a material in which any amount of carbon is mixed in silicon nitride. Fourth protective insulating film 220 suppresses the diffusion of copper into the oxide film. The film thickness is 20-100 nm. The third interconnect is formed at a position separated by a prescribed distance from the lead-out interconnects and is therefore shown by broken lines in FIG. 9A.

Figure 9B:
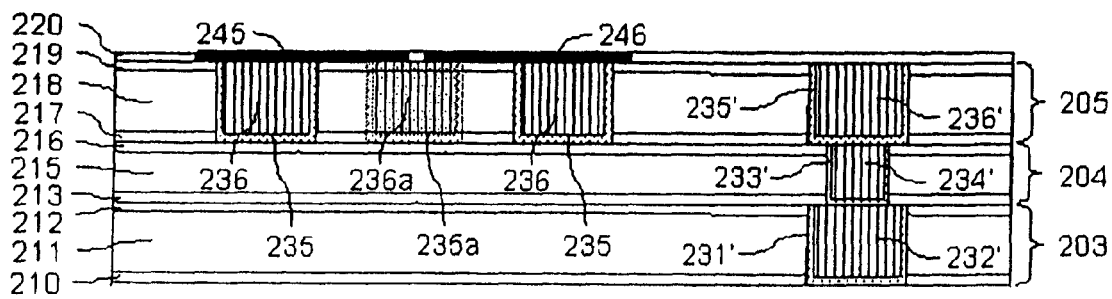
FIG. 9B is a sectional view showing the fabrication method of the solid electrolyte switching element of the third embodiment.

Next, as shown in FIG. 9B, first interconnect 245 and second interconnect 246 are formed on fourth protective insulating film 220 separated by the above-described micro distance as in the second embodiment.

Figure 9C:
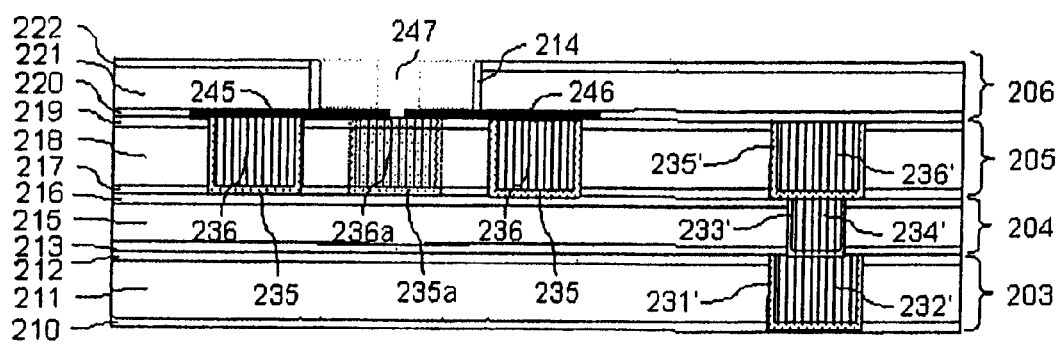
FIG. 9C is a sectional view showing the fabrication method of the solid electrolyte switching element of the third embodiment.

Fourth interlayer insulating film 221 and fourth stopper insulating film 222 are successively formed on fourth protective insulating film 220. A photoresist is applied to fourth stopper insulating film 222 and then subjected to an exposure process. The exposed photoresist is then subjected to a developing process to form a photoresist having an aperture. Etching is then carried out though the photoresist to form third aperture 247 in fourth interlayer insulating film 221 and fourth stopper insulating film 222. The formation of third aperture 247 exposes a portion of first interconnect 245, second interconnect 246, and third interconnect 236a. The photoresist is then removed, following which cover insulation film 214 is formed. Anisotropic etching is then carried out to leave cover insulation film 214 on the side walls of third aperture 247 (FIG. 9C).

Figure 9D:
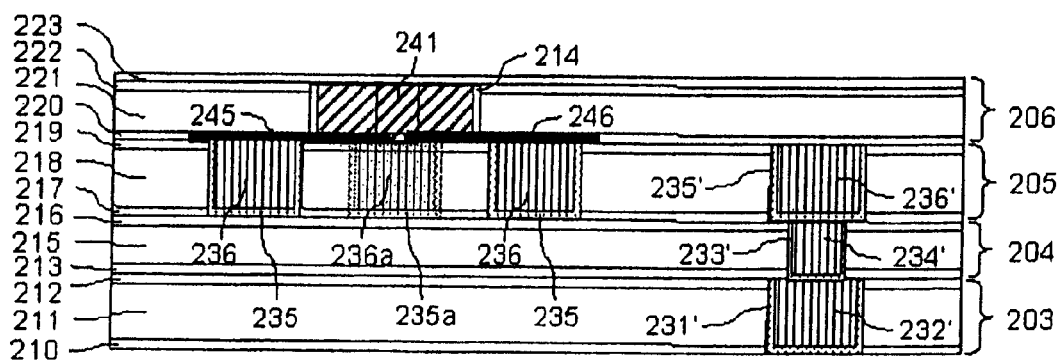
FIG. 9D is a sectional view showing the fabrication method of the solid electrolyte switching element of the third embodiment.

Next, after forming solid electrolyte layer 241 to bury third aperture 247, unnecessary solid electrolyte layer that formed at points outside third aperture 247 is removed by a CMP method. Fifth protective insulating film 223 is then formed on fourth stopper insulating film 222 (FIG. 9D). Fifth protective insulating film 223 serves the same role of preventing the diffusion of copper as fourth protective insulating film 220 and is therefore formed of the same material as fourth protective insulating film 220.

Solid electrolyte switching element 201 of the present embodiment is produced by the above-described fabrication method. The method enables the realization of an interconnect construction in which first interconnect 245 and second interconnect 246 are embedded in forth protective insulating film 220 separated by a micro distance that exceeds the limits of lithography. In addition, compared to the second embodiment, the above-described fabrication method facilitates the free control of the distance between third interconnect 236a that serves as the gate electrode and first interconnect 245 that serves as the source electrode and the distance between third interconnect 236a that serves as the gate electrode and second interconnect 246 that serves as the drain electrode.

In addition, because solid electrolyte layer 241 is formed above first interconnect 245, second interconnect 246, and third interconnect 236a, the locations at which elements can be formed are no longer limited within the interconnect layer, and the degree of freedom of element formation is improved. In particular, elements can be formed after completion of the multilayer interconnect steps. This increased freedom leads to both a reduction of the risk involved in introducing new materials and a reduction of costs. Three-terminal solid electrolyte switching element 200 that uses the interconnect construction formed by the above-described method was able to repeat stable switching operations.

Further, beginning with the steps for forming third interconnect 236a, the large number of steps that can be shared with multilayer interconnect fabrication steps, the minimization of the number of added masks to just two, the suppression of the diffusion of atoms into insulating films, and the measures taken for hydrogen annealing resistance all enable the introduction of this method to a production line at minimal additional cost. As described hereinabove, in the present embodiment, one expert in the art for forming multilayer interconnects of integrated circuits of the related art could easily carry out the above-described steps without requiring special steps.

Fourth Embodiment

Explanation next regards the configuration of the solid electrolyte switching element of the present embodiment.

Figure 10A:
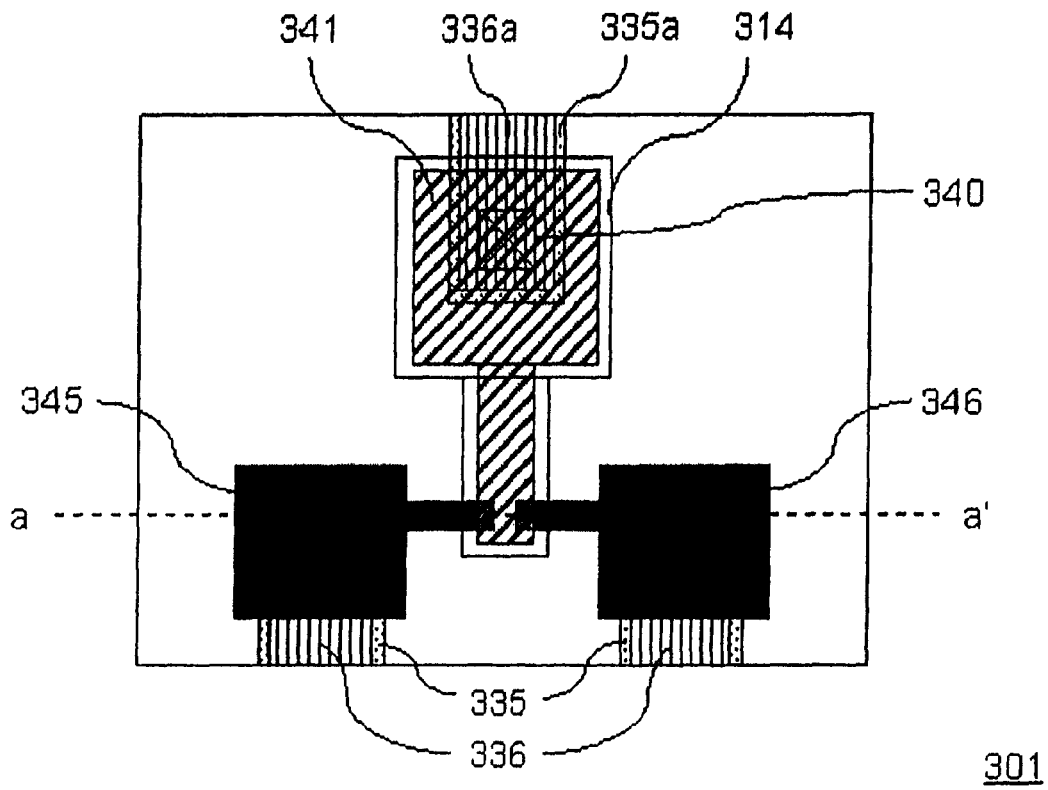
FIG. 10A is a plan view showing an example of the configuration of the solid electrolyte switching element of the fourth embodiment.
Figure 10B:
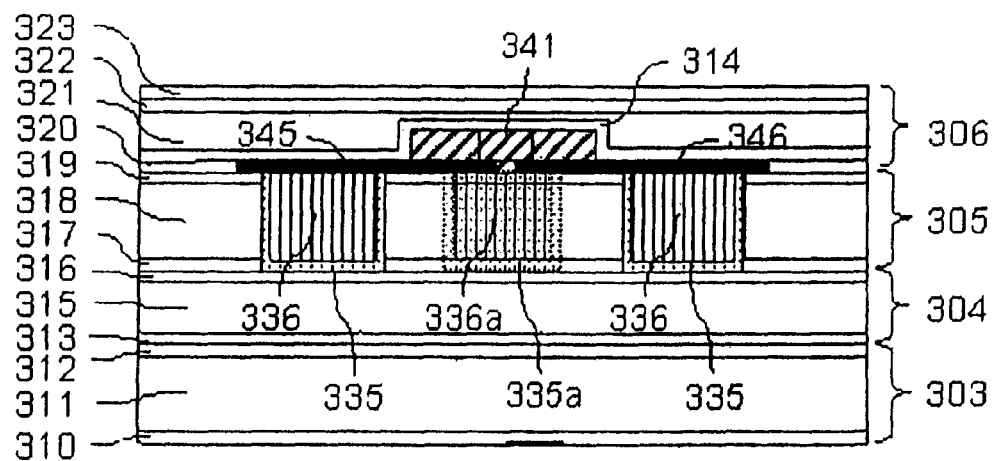
FIG. 10B is a sectional view showing an example of the solid electrolyte switching element of the fourth embodiment.

FIGS. 10A and 10B show an example of the configuration of the solid electrolyte switching element of the present embodiment. FIG. 10A is a plan view, and FIG. 10B is a sectional view taken along broken line a-a' shown in FIG. 1A.

Solid electrolyte switching element 301 of the present embodiment is of a configuration in which the film thickness of the solid electrolyte layer of the third embodiment has been made thinner than in the third embodiment. In the present embodiment, the film thickness of the solid electrolyte layer can be controlled. In addition, first interconnect layer 303 corresponds to first interconnect layer 203 of the third embodiment, first insulating layer 304 corresponds to first insulating layer 204, second interconnect layer 305 corresponds to second interconnect layer 205, and protective layer 306 corresponds to protective layer 206. The material and type of film in each layer is the same as in the third embodiment and detailed explanation of these points is therefore omitted.

In the present embodiment, the top surface and side surfaces of solid electrolyte layer 341 are covered by cover insulation film 314. In addition, the points of the bottom surface of solid electrolyte layer 341 that do not contact either of first interconnect 345 and second interconnect 346 are covered by fourth protective insulating film 320. Fourth protective insulating film 320 and cover insulation film 314 have the function of a metal diffusion prevention film.

The chief operations of solid electrolyte switching element 301 of the present embodiment are the same as in the first embodiment, and detailed explanation of these operations is therefore here omitted.

In solid electrolyte switching element 301 of the present embodiment, points of solid electrolyte layer 341 that do not contact any of first interconnect 345, second interconnect 346, and the third interconnect are covered by the metal diffusion prevention film of either of fourth protective insulating film 320 and cover insulation film 314, whereby metal ions do not diffuse to surrounding areas. As a result, metal ions can be prevented from adversely affecting neighboring elements, and the solid electrolyte switching element of the present embodiment can therefore be used in circuits that are integrated together with other elements.

The following brief explanation regards the fabrication method of solid electrolyte switching element 301 of the present embodiment. The fabrication method is the same as in the third embodiment other than the method of forming solid electrolyte layer 341, and detailed explanation is therefore here abbreviated.

Following the step shown in FIG. 9B, a solid electrolyte layer is formed to a desired film thickness on fourth protective insulating film 320. The solid electrolyte layer is processed to a desired pattern by lithography steps and etching steps to form solid electrolyte layer 341 shown in FIG. 10A. Cover insulation film 314 is then formed, following which fourth interlayer insulating film 321, fourth stopper insulating film 322, and fifth protective insulating film 323 are formed. In this way, solid electrolyte switching element 301 shown in FIG. 10B is produced.

Explanation next regards a configuration in which solid electrolyte switching element 301 shown in FIGS. 10A and 10B is applied to an integrated circuit. A via construction for connecting together semiconductor circuits is here shown as one part of the integrated circuit.

Figure 11:
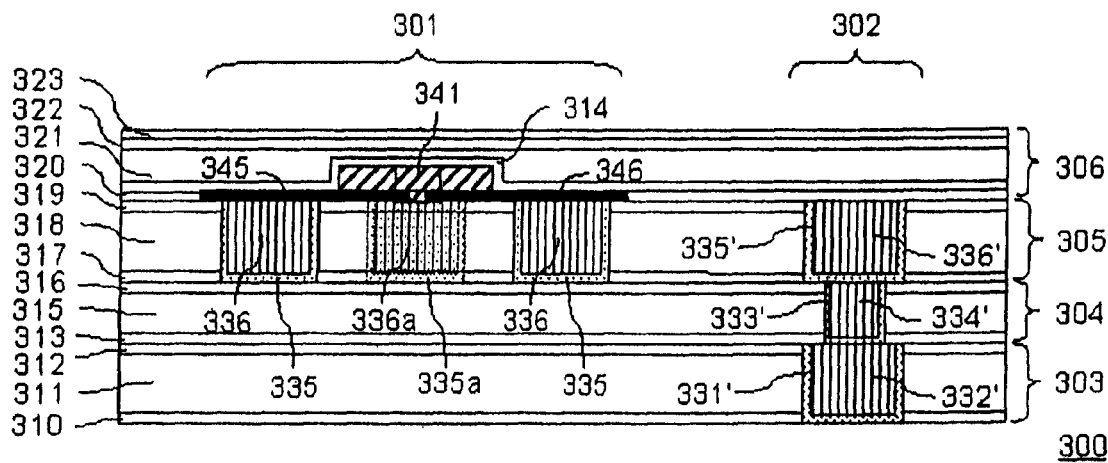
FIG. 11 is a sectional view of an integrated circuit that includes the solid electrolyte switching construction of the fourth embodiment and a via construction.

FIG. 11 is a sectional view showing a solid electrolyte switching element and a via construction. Components that are the same as components shown in FIGS. 10A and 10B are given the same reference numbers and detailed explanation of these parts is here omitted.

As shown in FIG. 11, the integrated circuit is a construction that includes solid electrolyte switching element 301 and via construction 302 for connecting together interconnects. Via construction 302 corresponds to via construction 202 of the third embodiment and detailed explanation of this construction is therefore here abbreviated.

The difference between the solid electrolyte switching element of the present embodiment and the third embodiment is the method of processing solid electrolyte layer 341. The third embodiment is a configuration in which solid electrolyte layer 241 is embedded in third aperture 247 provided in the three layers of fourth protective insulating layer 220, fourth interlayer insulating film 221, and fourth stopper insulating film 222 that are formed on second interconnect layer 205. In contrast to this configuration, in the present embodiment, the solid electrolyte layer is deposited so as to contact first interconnect 345, second interconnect 346, and the third interconnect, following which unnecessary points of the solid electrolyte layer are removed to form solid electrolyte layer 341 as shown in FIGS. 10A, 10B, and 11.

Compared to the third embodiment, the solid electrolyte switching element of the present embodiment facilitates the control of the film thickness of solid electrolyte layer 341. Controlling the film thickness of solid electrolyte layer 341 enables control over the amount of metal ions supplied to first interconnect 345 and second interconnect 346 and thus enables adjustment of the switching characteristics.

In addition, a CMP method is not used in the processing of solid electrolyte layer 341, whereby damage to solid electrolyte layer 341 is reduced and the reliability of the solid electrolyte switching elements in the integrated circuit is increased. In addition, the present embodiment can increase the choices of solid electrolyte layer 341 that can be used and can therefore realize a reduction of costs.

Fifth Embodiment

Explanation next regards the configuration of the solid electrolyte switching element of the present embodiment.

Figure 12A:
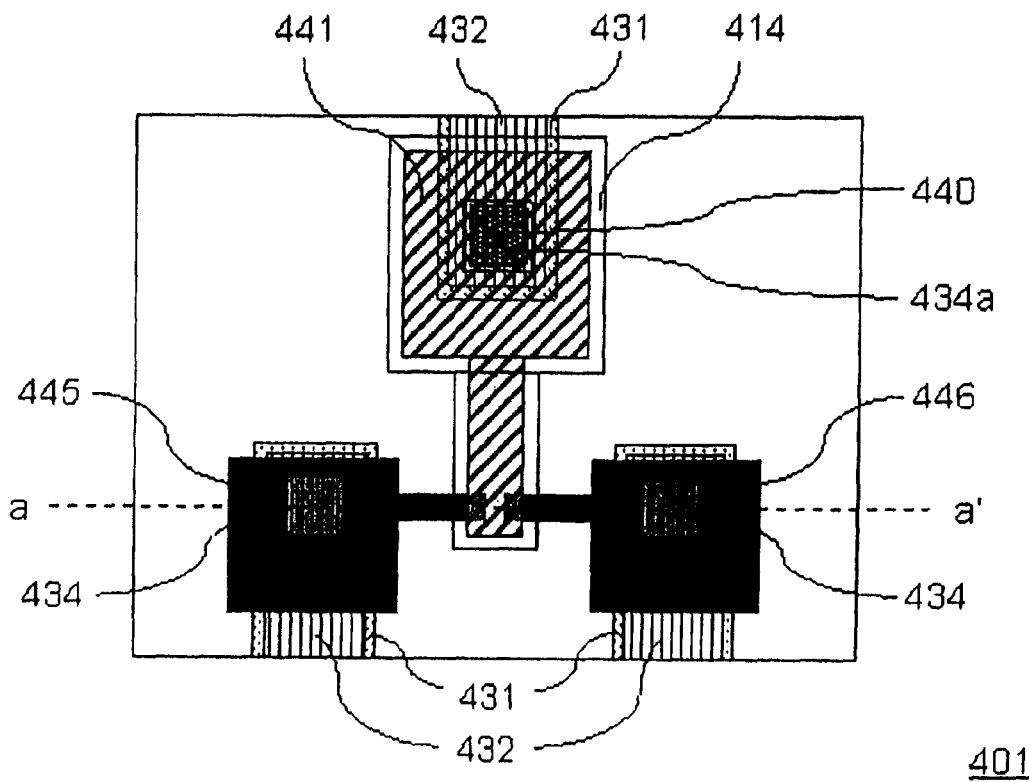
FIG. 12A is a plan view showing an example of the configuration of the solid electrolyte switching element of the fifth embodiment.
Figure 12B:
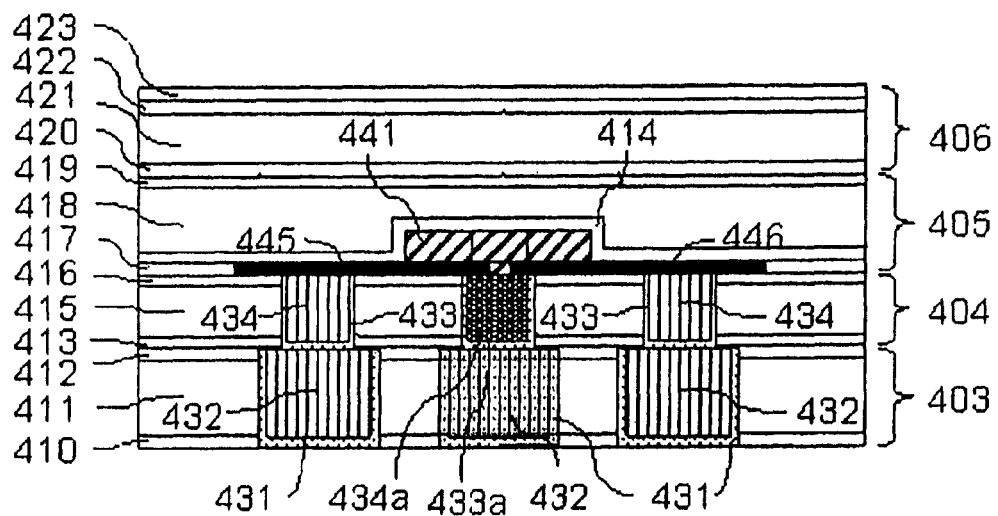
FIG. 12B is a sectional view showing an example of the configuration of the solid electrolyte switching element of the fifth embodiment.

FIGS. 12A and 12B show an example of the configuration of the solid electrolyte switching element of the present embodiment. FIG. 12A is a plan view, and FIG. 12B is a sectional view taken along broken line a-a' shown in FIG. 12A. In the construction shown in FIGS. 12A and 12B, first interconnect layer 403 corresponds to first interconnect layer 303 of the fourth embodiment, first insulating layer 404 corresponds to first insulating layer 304, second interconnect layer 405 corresponds to second interconnect layer 305, and protective layer 406 corresponds to protective layer 306. The type and material of films in each layer are the same as in the fourth embodiment and detailed explanation is therefore here omitted.

In solid electrolyte switching element 401 of the present embodiment, solid electrolyte layer 441, first interconnect 445, and second interconnect 446 are provided on second interconnect layer 405. In addition, the third interconnect is provided on first insulating layer 404. The lead-out interconnects of first interconnect 445, second interconnect 446, and the third interconnect are provided on first interconnect layer 403. The third interconnect is a configuration that includes copper 434a and barrier metal 433a for preventing the diffusion of copper. In addition, viaplugs for connecting each of first interconnect 445 and second interconnect 446 are provided in first insulating layer 404.

In the present embodiment, the upper surface and side surfaces of solid electrolyte layer 441 are covered by cover insulation film 414. In addition, points of the bottom surface of solid electrolyte layer 441 that do not contact either of first interconnect 445 and second interconnect 446 are covered by third protective insulating film 417. Third protective insulating film 417 and cover insulation film 414 have the function of a metal diffusion prevention film.

The chief operations of solid electrolyte switching element 401 of the present embodiment are the same as in the first embodiment and detailed explanation of these operations is therefore here abbreviated.

In solid electrolyte switching element 401 of the present embodiment, points of solid electrolyte layer 441 that do not contact any of first interconnect 445, second interconnect 446, and the third interconnect are covered by one of the metal diffusion prevention films of third protective insulating film 417 and cover insulation film 414, and metal ions therefore do not diffuse to surrounding areas. As a result, metal ions can be prevented from adversely affecting neighboring elements, and the solid electrolyte switching element of the present embodiment can be used in circuits that are integrated together with other elements.

Explanation next regards a configuration in which solid electrolyte switching element 401 shown in FIGS. 12A and 12B is applied to an integrated circuit. A via construction for connecting together semiconductor circuits is here shown as a part of the integrated circuit.

Figure 13:
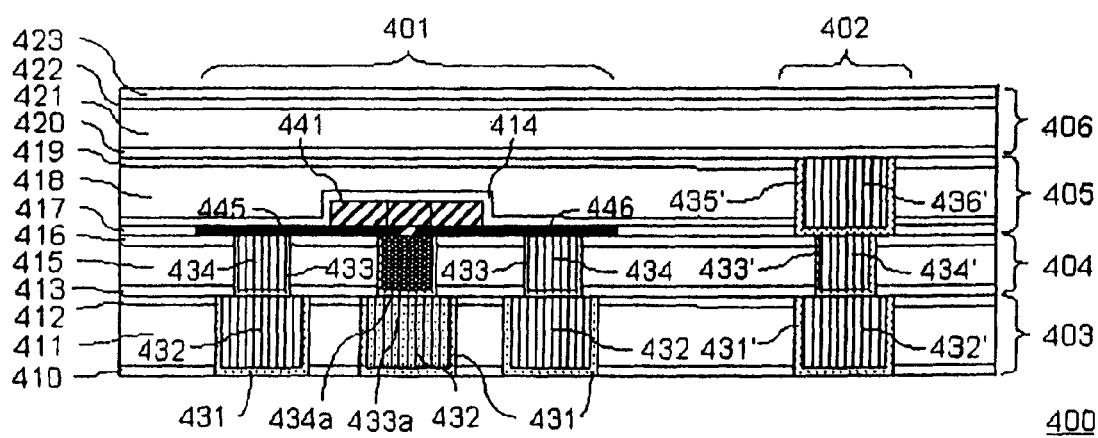
FIG. 13 is a sectional view of an integrated circuit that includes the solid electrolyte switching construction of the fifth embodiment and a via construction.

FIG. 13 is a sectional view showing a solid electrolyte switching element and a via construction. Components that are the same as components shown in FIGS. 12A and 12B are given the same reference numbers, and detailed explanation of these components is here omitted.

As shown in FIG. 13, the integrated circuit is of a configuration that includes solid electrolyte switching element 401 and via construction 402 for connecting together interconnects. Via construction 402 includes: first circuit interconnect provided on first interconnect layer 403, second circuit interconnect provided on second interconnect layer 405, and a viaplug for connecting first circuit interconnect and second circuit interconnect. The viaplug is formed in first insulating layer 404. The layer in which this viaplug is formed is referred to as the "via layer."

Explanation next regards the points of difference between the solid electrolyte switching element of the present embodiment and that of the fourth embodiment. In the fourth embodiment, third interconnect 336a for supplying metal ions to solid electrolyte layer 341 is provided in second interconnect layer 305, but in the present embodiment, third interconnect 434a for supplying metal ions to solid electrolyte layer 441 is provided in first insulating layer (via layer) 404.

In the solid electrolyte switching element of the present embodiment, the third interconnect is formed in the via layer, whereby adjustment of the size of the via-hole makes control of the total amount of metal ions that can be supplied to solid electrolyte layer 441 easier than in the fourth embodiment. The switching characteristics can therefore be more easily adjusted. In addition, the metal that can be supplied is confined in the shape of the viaplug, allowing the possibility of using metals other than copper, which is the multilayer interconnect material, and further facilitating the adjustment of switching characteristics through the selection of the type of metal.

Sixth Embodiment

Explanation next regards the configuration of the solid electrolyte switching element of the present invention.

Figure 14A:
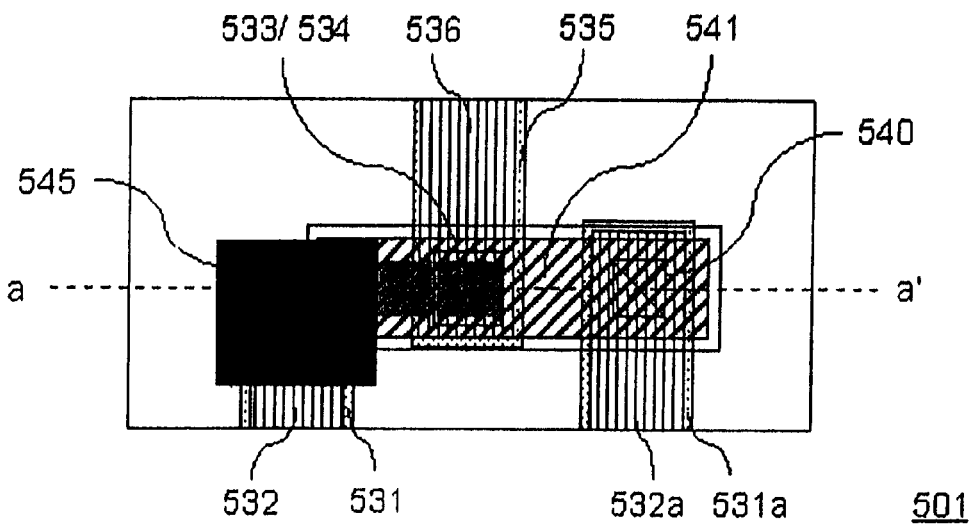
FIG. 14A is a plan view showing an example of the configuration of the solid electrolyte switching element of the sixth embodiment.
Figure 14B:
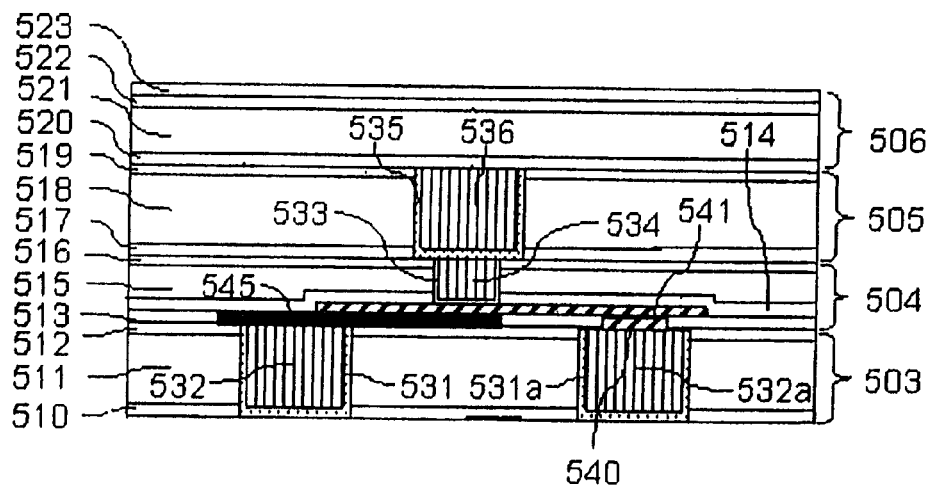
FIG. 14B is a sectional view showing an example of the configuration of the solid electrolyte switching element of the sixth embodiment.

FIGS. 14A and 14B show an example of the configuration of the solid electrolyte switching element of the present invention. FIG. 14A is a plan view and FIG. 14B is a sectional view taken along broken line a-a' shown in FIG. 14A. In the construction shown in FIGS. 14A and 14B, first interconnect layer 503 corresponds to first interconnect layer 303 of the fourth embodiment, first insulating layer 504 corresponds to first insulating layer 304, second interconnect layer 505 corresponds to second interconnect layer 305, and protective layer 506 corresponds to protective layer 306. The type and material of films in each layer are the same as in the fourth embodiment, and detailed explanation of these points is therefore here abbreviated.

Solid electrolyte switching element 501 of the present embodiment is of a configuration that includes first interconnect 545 and solid electrolyte layer 541 provided on second protective insulating film 513; second interconnect provided on first insulating layer 504; and third interconnect provided on first interconnect layer 503. The third interconnect is of a configuration that includes copper 532a and barrier metal 531a for preventing the diffusion of copper. The second interconnect is of a configuration that includes copper 534 and barrier metal 533 for preventing the diffusion of copper. In the following description, the second interconnect is indicated by reference number 533 and the third interconnect is indicated by reference number 532a.

In the present embodiment, the upper surface and side surfaces of solid electrolyte layer 541 are covered by cover insulation film 514. In addition, points of the bottom surface of solid electrolyte layer 541 that do not contact either of first interconnect 545 and third interconnect 532a are covered by second protective insulating film 513. Second protective insulating film 513 and cover insulation film 514 have the function of metal diffusion prevention films.

The chief operations of solid electrolyte switching element 501 of the present embodiment are the same as in the first embodiment and detailed explanation of these operations is therefore here omitted.

In solid electrolyte switching element 501 of the present embodiment, points of solid electrolyte layer 541 that do not contact any of first interconnect 545, second interconnect 533, and the third interconnect are covered by the metal diffusion prevention films of one of second protective insulating film 513 and cover insulation film 514, and metal ions therefore do not diffuse to surrounding areas. The metal ions can therefore be prevented from adversely affecting neighboring elements, and the solid electrolyte switching element of the present embodiment can be used in circuits that are integrated together with other elements.

Explanation next regards a configuration in which solid electrolyte switching element 501 shown in FIGS. 14A and 14B is applied in an integrated circuit. In this case, a via construction for connecting together semiconductor circuits is shown as one part of the integrated circuit.

Figure 15:
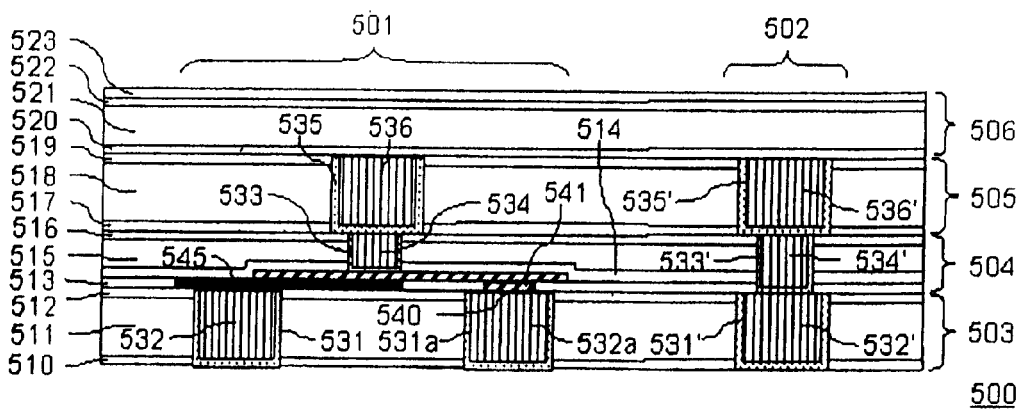
FIG. 15 is a sectional view of an integrated circuit that includes the solid electrolyte switching construction of the sixth embodiment and a via construction.

FIG. 15 is a sectional view showing the solid electrolyte switching element and via construction. Components that are the same as components shown in FIGS. 14A and 14B are given the same reference numbers and detailed explanation of these components is here omitted.

As shown in FIG. 15, the integrated circuit is of a configuration that includes solid electrolyte switching element 501 and via construction 502 for connecting together interconnects. Via construction 502 includes a first circuit interconnect provided in first interconnect layer 503, a second circuit interconnect provided in second interconnect layer 505, and a viaplug for connecting the first circuit interconnect and the second circuit interconnect. The viaplug is formed in first insulating layer 504. The layer in which this viaplug is formed is referred to as the "via layer."

Explanation next regards the points of difference between the solid electrolyte switching element of the present embodiment and the first to fifth embodiments. The biggest difference is the method of forming the spacing between the first interconnect and the second interconnect. A comparison will be made with the first embodiment, which is taken as a representative example from among the first to fifth embodiments. In the first embodiment, first interconnect 14 and second interconnect 15 are formed on insulating layer 11 separated by a minute spacing. In the present embodiment, in contrast, first interconnect 545 and second interconnect 533 are separated by solid electrolyte layer 541. In the present embodiment, first interconnect 545 is formed on second protective insulating film 513, and second interconnect 533 is formed on the three insulating films of cover insulation film 514, second interlayer insulating film 515, and second stopper insulating film 516. First interconnect 545 and second interconnect 533 are formed sandwiching solid electrolyte layer 541. In addition, third interconnect 532a is formed of a material that can supply metal ions. Thus, when transitioning from the OFF state to the ON state, metal ions diffuse into solid electrolyte layer 541 from third interconnect 532a and precipitate between first interconnect 545 and second interconnect 533, whereby solid electrolyte switching element 501 switches from the OFF state to the ON state.

Compared with the first to fifth embodiments, the solid electrolyte switching element of the present embodiment allows control of the spacing between first interconnect and second interconnect by the film thickness of solid electrolyte layer 541.

The layer interposed between first interconnect 545 and second interconnect 533 may also be a spacer layer made up by an insulating film that contains a solid electrolyte. As the functions of the inserted spacer layer, the spacer layer should be able to electrically isolate first interconnect 545 and second interconnect 533, and further, form a precipitate at the point at which first interconnect 545 and second interconnect 533 contact the solid electrolyte layer.

The following brief explanation regards the fabrication method of the solid electrolyte switching element of the present embodiment. Detailed explanation regarding steps that are the same as steps in the second embodiment and the third embodiment is here omitted.

Three insulating films that make up first insulating layer 503 are formed on a substrate (not shown) on which an insulating film has been formed on the uppermost layer. As in the second embodiment, a lead-out interconnect and third interconnect 532a are formed in the solid electrolyte switching element formation region, and a first circuit interconnect is formed in the via construction 502 formation region. The lead-out interconnect includes copper 532 and barrier metal 531, and the third interconnect includes copper 532a and barrier metal 531a.

Second protective insulating film 513 is next formed on first interconnect layer 503. Second protective insulating film 513 is formed from silicon nitride or a material in which any amount of carbon is mixed in silicon nitride. Second protective insulating film 513 suppresses the diffusion of copper into the oxide film. The film thickness is 20-100 nm. First interconnect 545 that contacts the lead-out interconnect is then formed on second protective insulating film 513 as in the second embodiment.

An aperture is then provided in second protective insulating film 513 on third interconnect 532a by lithography and etching steps to expose a portion of third interconnect 532a, which supplies metal ions to solid electrolyte layer 541. After next depositing a solid electrolyte layer, solid electrolyte layer 541 as shown in FIGS. 14A and 14B is formed by carrying out lithography and etching steps. Cover insulation film 514 is then deposited to completely cover solid electrolyte layer 541 and second protective insulating film 513. Cover insulation film 514 is formed from silicon nitride or a material in which any amount of carbon is mixed with silicon nitride. Cover insulation film 514 suppresses the diffusion of copper into the oxide film. Second interlayer insulating film 515 and second stopper insulating film 516 are then deposited on cover insulation film 514.

An aperture is next formed by means of lithography steps and etching steps in cover insulation film 514, second interlayer insulating film 515, and second stopper insulating film 516, and the second interconnect is formed in this aperture as in the second embodiment. The second interconnect is of a configuration that includes copper 534 and barrier metal 533. Barrier metal 533 covers the bottom surface and side surfaces of copper 534. In forming the second interconnect, the second interconnect is arranged at a position to confront first interconnect 545 with solid electrolyte 541 interposed. Then, as in the second embodiment, the lead-out interconnect of the second interconnect is formed in the solid electrolyte switching element 501 formation region, and protective layer 506 is formed.

Solid electrolyte switching element 501 of the present embodiment is produced by the above-described fabrication method. Making the film thickness of the solid electrolyte layer thinner than the minimum value of the limits of lithography allows the realization of an interconnect construction in which first interconnect 545 and second interconnect 533 are each formed on separate insulating films and are separated by a minute distance that surpasses the limits of lithography. The component that separates first interconnect 545 and second interconnect 533 is solid electrolyte layer 541. The spacing between the first interconnect and the second interconnect that are separated by a micro spacing can be realized by merely controlling the film thickness of solid electrolyte layer 541. The setting of the spacing by film thickness control is easier than control by means of dry etching as in the first embodiment and results in a reduction of variations in fabrication as well as an increase production yield of solid electrolyte switching elements in integrated circuits.

In addition, the present embodiment facilitates the free control of both the distance between third interconnect 532a, which is the gate electrode, and first interconnect 545, which is the source electrode, and the distance between third interconnect 532a, which is the gate electrode, and second interconnect 533, which is the drain electrode. Metal ions supplied from third interconnect 532a diffuse over this distance, and control of this distance therefore can determine the switching characteristics. The present embodiment thus enables control of the characteristics of the solid electrolyte switching element in an integrated circuit. In particular, making the distance from third interconnect 532a to first interconnect 545 and second interconnect 533 greater than in the related art is effective for preventing the occurrence of switching from the OFF state to the ON state. As a result, solid electrolyte switching element 501 can achieve greater stability in repeated switching operations.

Beginning with the formation steps of third interconnect 532a and second interconnect 533, the great number of steps that can be shared with the multilayer interconnect formation steps, the suppression of the diffusion of atoms into insulating films and the implementation of measures for hydrogen annealing resistance all enable introduction of the present invention to a production line at minimal additional cost. As described hereinabove, one versed in the art of forming multilayer interconnects of integrated circuits of the related art could easily carry out the above-described steps in the present embodiment without requiring special steps.

In addition, although explanation in the above-described first to sixth embodiments regarded cases in which the first interconnect was taken as the source electrode and the second interconnect was taken as the drain electrode, the second interconnect may be taken as the source electrode and the first interconnect may be taken as the drain electrode.

Finally, the present invention is not limited by any of the above-described embodiments and is open to various modifications within the scope of the invention, these modifications obviously being included within the scope of the present invention.

The invention claimed is:

1. A solid electrolyte switching element comprising:
a first electrode and a second electrode provided in a first insulating layer having the function of preventing metal diffusion;
a solid electrolyte layer that contacts said first electrode and said second electrode and that is provided on a layer above said first insulating layer;
a metal diffusion prevention film that covers said solid electrolyte layer and that includes an aperture that exposes a portion of said solid electrolyte layer; and
a third electrode that contacts said solid electrolyte layer by way of said aperture and that can supply metal ions.

2. The solid electrolyte switching element according to claim 1, further provided with a second insulating layer provided between said first insulating layer and said solid electrolyte layer, in which an aperture is formed through which said solid electrolyte layer contacts said first electrode and said second electrode, and having the function of preventing metal diffusion.

3. The solid electrolyte switching element according to claim 2, wherein said first insulating layer is a compound film composed of silicon and any amount of nitrogen, oxygen, and carbon.

4. The solid electrolyte switching element according to claim 2, wherein said second insulating layer is a compound film composed of silicon and any amount of nitrogen, oxygen, and carbon.

5. The solid electrolyte switching element according to claim 1, wherein said first insulating layer is a compound film composed of silicon and any amount of nitrogen, oxygen, and carbon.

6. A solid electrolyte switching element comprising:
a first electrode and a second electrode provided separated by prescribed distance;
a solid electrolyte layer provided in contact with said first electrode and said second electrode;
a third electrode that is provided in contact with said solid electrolyte layer and that can supply metal ions; and
a metal diffusion prevention film that covers points of a surface of said solid electrolyte layer that do not contact any of said first electrode, said second electrode, and said third electrode, wherein:

an interconnect construction that includes said first electrode, said second electrode and said third electrode, is provided in an insulating layer; and said solid electrolyte layer is provided on said interconnect construction.

7. A solid electrolyte switching element comprising:

a first electrode and a second electrode provided separated by prescribed distance;

a solid electrolyte layer provided in contact with said first electrode and said second electrode;

a third electrode that is provided in contact with said solid electrolyte layer and that can supply metal ions; and a metal diffusion prevention film that covers points of a surface of said solid electrolyte layer that do not contact any of said first electrode, said second electrode, and said third electrode, wherein:

said third electrode is provided in a first insulating layer, an interconnect construction that includes said first electrode and said second electrode, is provided in a second insulating layer that is on said first insulating layer, and said solid electrolyte layer is provided on said interconnect construction.

8. A solid electrolyte switching element comprising:

a first electrode and a first aperture provided in an insulating layer having the function of preventing the diffusion of metal;

a solid electrolyte layer provided on said insulating layer, contacting said first electrode, and covering said first aperture;

a metal diffusion prevention film covering said solid electrolyte layer and having a second aperture that exposes a portion of said solid electrolyte layer;

a second electrode that contacts said solid electrolyte layer by way of said second aperture; and a third electrode contacting said solid electrolyte layer by way of said first aperture provided in said insulating layer and that can supply metal ions.

9. A solid electrolyte switching element comprising:

a first electrode and a second electrode provided separated by prescribed distance;

a solid electrolyte layer provided in contact with said first electrode and said second electrode;

a third electrode that is provided in contact with said solid electrolyte layer and that can supply metal ions; and a metal diffusion prevention film that covers points of a surface of said solid electrolyte layer that do not contact any of said first electrode, said second electrode, and said third electrode, wherein said third electrode is composed of a metal that contains copper, and points of said third electrode that do not contact said solid electrolyte layer are covered by at least one of a barrier metal and a metal diffusion prevention film.

10. The solid electrolyte switching element according to claim 9, wherein said barrier metal is a material containing at least one of tantalum, tantalum nitride, titanium, and titanium nitride.

11. A solid electrolyte switching element comprising:

a first electrode and a second electrode provided separated by prescribed distance;

a solid electrolyte layer provided in contact with said first electrode and said second electrode;

a third electrode that is provided in contact with said solid electrolyte layer and that can supply metal ions; and a metal diffusion prevention film that covers points of a surface of said solid electrolyte layer that do not contact any of said first electrode, said second electrode, and said third electrode, wherein said metal diffusion prevention film is a compound film composed of silicon and any amount of nitrogen, oxygen, and carbon.

12. A solid electrolyte switching element comprising:

a first electrode and a second electrode provided separated by prescribed distance;

a solid electrolyte layer provided in contact with said first electrode and said second electrode;

a third electrode that is provided in contact with said solid electrolyte layer and that can supply metal ions; and a metal diffusion prevention film that covers points of a surface of said solid electrolyte layer that do not contact any of said first electrode, said second electrode, and said third electrode, wherein at least one of said solid electrolyte and said third electrode are embedded in a multilayer insulating film in which a plurality of insulating films are stacked.

13. The solid electrolyte switching element according to claim 12, wherein said multilayer insulating film includes at least one insulating film from among a compound insulating film composed of silicon and any amount of nitrogen, oxygen, and carbon and a low-permittivity insulating film in which the permittivity is lower than a silicon oxide film.

14. The solid electrolyte switching element according to claim 13, wherein said low-permittivity insulating film is a film of a compound of silicon and an oxygen and contains fluorine, hydrogen, and carbon.

15. The solid electrolyte switching element according to claim 13, wherein said low-permittivity insulating film is an insulating film containing holes.

16. The solid electrolyte switching element according to claim 15, wherein the diameter of said holes is no greater than 2 nm.

17. An integrated circuit comprising:

a solid electrolyte switching element comprising a first electrode and a second electrode provided separated by prescribed distance, a solid electrolyte layer provided in contact with said first electrode and said second electrode, a third electrode that is provided in contact with said solid electrolyte layer and that can supply metal ions, and a metal diffusion prevention film that covers points of a surface of said solid electrolyte layer that do not contact any of said first electrode, said second electrode, and said third electrode; and a multilayer interconnect that includes an interconnect and a viaplug;

wherein:

said third electrode is provided on the same layer as said interconnects; and said solid electrolyte layer is provided on the same layer as said viaplug.

18. A fabrication method of a solid electrolyte switching element that includes a first electrode, a second electrode, and a third electrode, said fabrication method comprising the steps of:

forming a first aperture in a first insulating layer;

embedding an interconnect material that can supply metal ions in said first aperture to form said third electrode;

forming a second insulating layer on said first insulating layer;

forming a second aperture that exposes a portion of said third electrode in said second insulating layer;

forming a metal diffusion prevention film on the side walls of said second aperture;

embedding a solid electrolyte layer in said second aperture;

forming a third insulating layer on said second insulating layer;

forming a resist having a third aperture pattern and a fourth aperture pattern separated by a prescribed distance on said third insulating layer;

enlarging the area of apertures of said third aperture pattern and said fourth aperture pattern by a first etching;

carrying out a second etching on said third insulating layer with said resist as a mask to form a third aperture and a fourth aperture that expose a portion of said solid electrolyte layer respectively in said third insulating layer; and after removing said resist, embedding an interconnect material in said third aperture and said fourth aperture to form said first electrode and second electrode.

19. A fabrication method of a solid electrolyte switching element that includes a first electrode, a second electrode, and a third electrode, said fabrication method comprising the steps of:

forming a first aperture in a first insulating layer;

embedding an interconnect material that can supply metal ions in said first aperture to form said third electrode;

forming a second insulating layer on said first insulating layer;

forming a second aperture that exposes a portion of said third electrode in said second insulating layer;

forming a metal diffusion prevention film on the side walls of said second aperture;

embedding a solid electrolyte layer in said second aperture;

forming a third insulating layer on said second insulating layer;

forming a resist having a third aperture pattern and a fourth aperture pattern separated by a prescribed distance on said third insulating layer;

carrying out a first etching on said third insulating layer with said resist as a mask to form a third aperture and a fourth aperture that expose a portion of said solid electrolyte layer respectively in said third insulating layer;

carrying out a second etching on said third insulating layer to enlarge the area of apertures of said third aperture and said fourth aperture; and after removing said resist, embedding an interconnect material in said third aperture and said fourth aperture to form said first electrode and second electrode.

* * * * *